(12) United States Patent
Sakong et al.

(10) Patent No.: US 10,497,828 B2
(45) Date of Patent: Dec. 3, 2019

(54) LIGHT-EMITTING DEVICES AND METHODS OF MANUFACTURING THE SAME

(71) Applicant: Samsung Electronics Co., Ltd., Suwon-si, Gyeonggi-do (KR)

(72) Inventors: Tan Sakong, Seoul (KR); Byoung-kyun Kim, Seongnam-si (KR); Jin-young Lim, Gwacheon-si (KR); Jae-sung Hyun, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/906,539

(22) Filed: Feb. 27, 2018

(65) Prior Publication Data

US 2019/0123237 A1    Apr. 25, 2019

(30) Foreign Application Priority Data

Oct. 19, 2017    (KR) .................. 10-2017-0135872

(51) Int. Cl.
*H01L 33/02* (2010.01)
*H01L 33/32* (2010.01)
(Continued)

(52) U.S. Cl.
CPC ........ *H01L 33/025* (2013.01); *H01L 33/0075* (2013.01); *H01L 33/06* (2013.01);
(Continued)

(58) Field of Classification Search
None
See application file for complete search history.

(56) References Cited

U.S. PATENT DOCUMENTS 6,372,608 B1    4/2002    Shimoda et al.
6,645,830 B2    11/2003    Shimoda et al.
(Continued)

FOREIGN PATENT DOCUMENTS

KR    10-0943092 B1    2/2010
KR    10-1125449 B1    3/2012
(Continued)

OTHER PUBLICATIONS

Chu-Young Cho et al., "High-efficiency light emitting diode with air voids embedded in lateral epitaxially overgrown GaN using a metal mask"., Jul. 4, 2011/vol. 19 No. S4/Optics Express A934.

*Primary Examiner* — Mounir S Amer
(74) *Attorney, Agent, or Firm* — Harness, Dickey & Pierce, P.L.C.

(57) ABSTRACT

A light-emitting device includes a light-emitting structure including a first-conductivity-type nitride semiconductor layer on a substrate, an active layer on the first-conductivity-type nitride semiconductor layer, and a second-conductivity-type nitride semiconductor layer on the active layer, and a buffer layer between the substrate and the light-emitting structure. The buffer layer includes a plurality of voids. The plurality of voids extend vertically into the buffer layer from a surface of the buffer layer. The surface of the buffer layer is proximate to the light-emitting structure. The plurality of voids have different horizontal sectional areas.

19 Claims, 18 Drawing Sheets

(51) Int. Cl.
 *H01L 33/12* (2010.01)
 *H01L 33/06* (2010.01)
 *H01L 33/00* (2010.01)
 *H01L 33/22* (2010.01)

(52) U.S. Cl.
 CPC .............. *H01L 33/12* (2013.01); *H01L 33/32* (2013.01); *H01L 33/22* (2013.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,476,088 B2 | 7/2013 | Lee et al. |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,082,934 B2 * | 7/2015 | Huang ............... H01L 33/0095 |
| 2004/0021147 A1 * | 2/2004 | Ishibashi ............... H01L 33/007 257/103 |
| 2012/0049151 A1 | 3/2012 | Zhang et al. |
| 2012/0119184 A1 * | 5/2012 | Hsu ................ H01L 33/22 257/13 |
| 2012/0199810 A1 * | 8/2012 | Lee .................. H01L 21/02381 257/13 |
| 2015/0179878 A1 * | 6/2015 | Park ................ H01L 21/02458 257/13 |
| 2015/0207034 A1 | 7/2015 | Sakong et al. |
| 2015/0325741 A1 | 11/2015 | Komada |
| 2018/0315887 A1 * | 11/2018 | Choi ..................... H01L 33/12 |

FOREIGN PATENT DOCUMENTS

| | | |
|---|---|---|
| KR | 2013-0021931 A | 3/2013 |
| KR | 10-1355086 B1 | 1/2014 |
| KR | 10-1391960 B1 | 5/2014 |
| KR | 2014-0084621 A | 7/2014 |

* cited by examiner

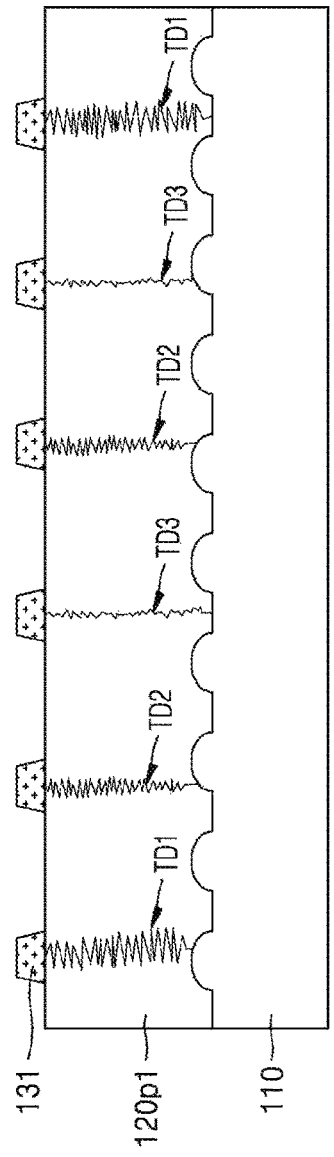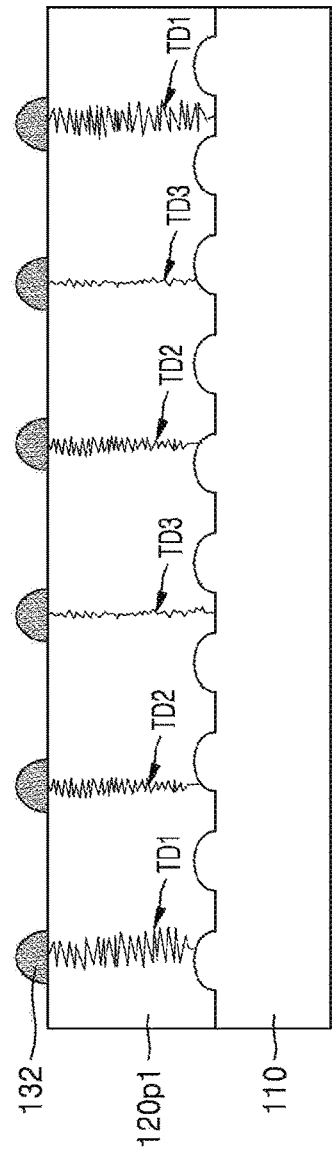

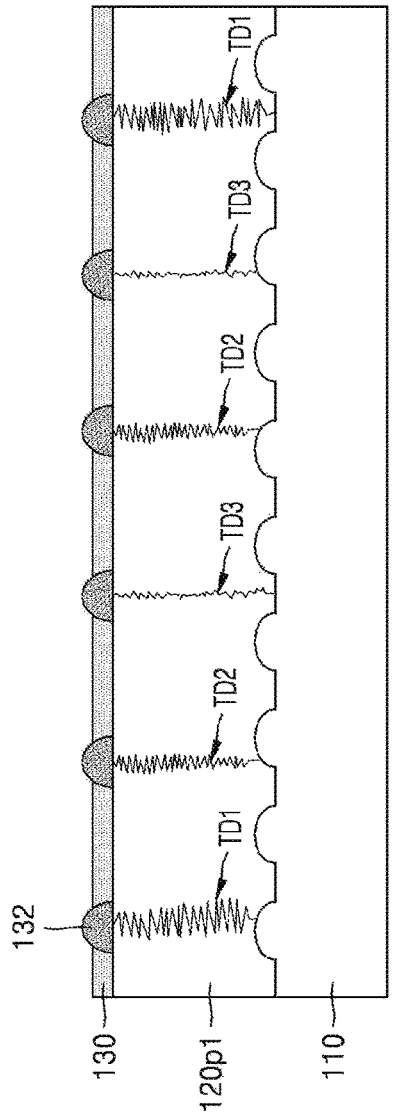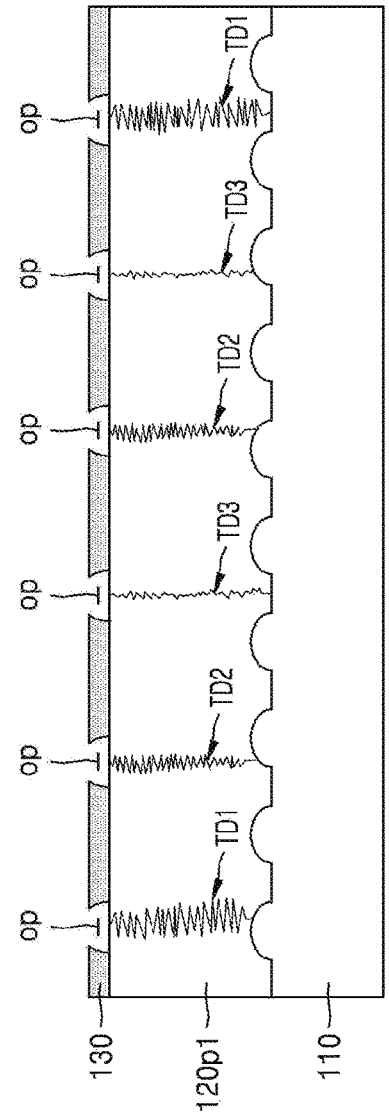

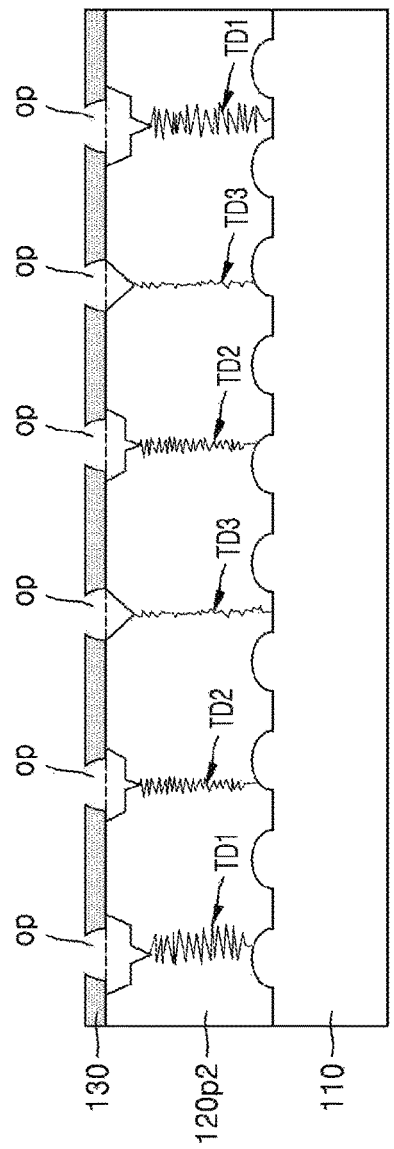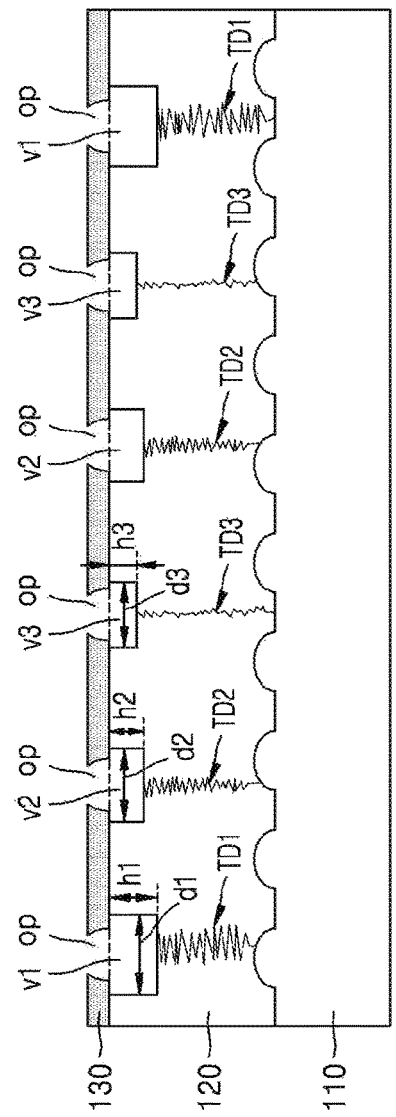

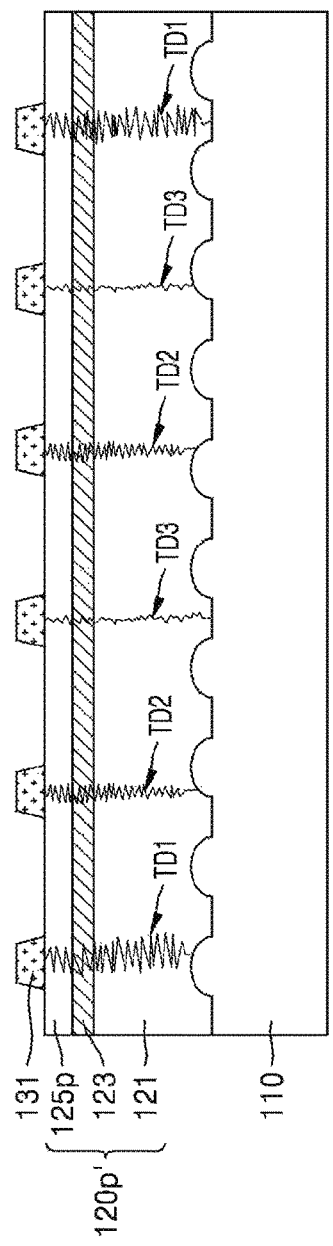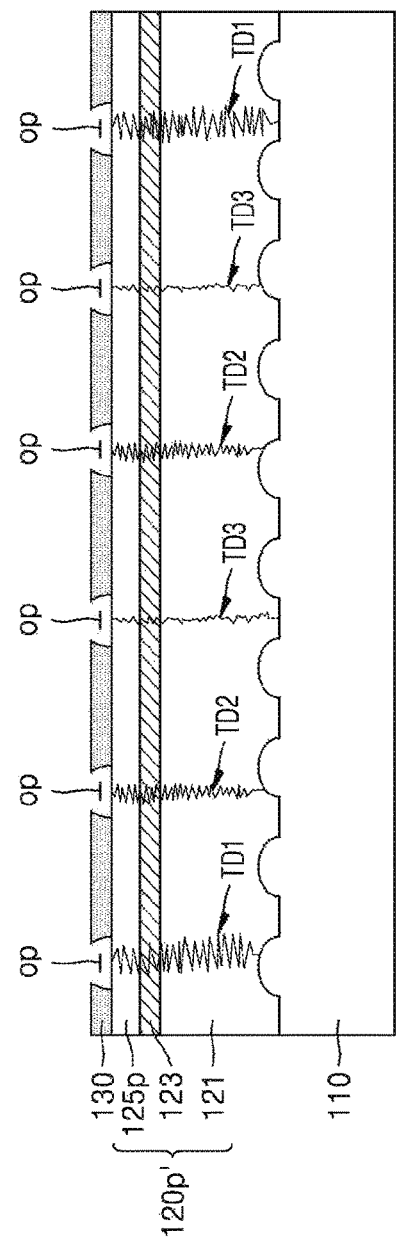

LIGHT-EMITTING DEVICES AND METHODS OF MANUFACTURING THE SAME

CROSS-REFERENCE TO RELATED APPLICATION

This application claims the benefit, under 35 U.S.C. § 119, of Korean Patent Application No. 10-2017-0135872, filed on Oct. 19, 2017, in the Korean Intellectual Property Office, the disclosure of which is incorporated herein in its entirety by reference.

BACKGROUND

The inventive concepts relate to light-emitting devices and methods of manufacturing the same, and more particularly, to light-emitting devices having voids and methods of manufacturing the same.

Light-emitting devices of the related art have been problematic in that light extraction efficiency of said light-emitting devices is degraded due to a high refractive index of nitride semiconductor of said light-emitting devices and luminous efficiency of said light-emitting devices is degraded due to residual stress caused by a difference in lattice constant between an indium gallium nitride (InGaN) active layer of said light-emitting devices and a gallium nitride (GaN)-based current injection layer of said light-emitting devices.

SUMMARY

In some example embodiments, a technique of elevating light extraction efficiency by forming a concave-convex structure on a surface of a substrate and a technique of reducing residual stress by providing a stress reducing layer including low InGaN content under an active layer has been developed.

In some example embodiments, one or more techniques of forming a light-emitting device having a porous structure including voids formed in a buffer layer may simultaneously solve the degradation of light extraction efficiency and the occurrence of residual stress by using a single structure.

Some example embodiments of the inventive concepts provide a light-emitting device having enhanced reliability.

Some example embodiments of the inventive concepts also provide a light-emitting device having improved light extraction efficiency.

Some example embodiments of the inventive concepts should not be limited by the above description, and other unmentioned aspects will be clearly understood by one of ordinary skill in the art from embodiments described herein.

According to some example embodiments, there is provided a light-emitting device. The light-emitting device may include a light-emitting structure on a substrate and a buffer layer between the substrate and the light-emitting structure. The light-emitting structure may include a first-conductivity-type nitride semiconductor layer on the substrate, an active layer on the first-conductivity-type nitride semiconductor layer, and a second-conductivity-type nitride semiconductor layer on the active layer. The buffer layer may include a plurality of voids, the plurality of voids extending vertically into the buffer layer from a surface of the buffer layer, the surface proximate to the light-emitting structure, the plurality of voids having different horizontal sectional areas.

According to some example embodiments, there is provided a light-emitting device. The light-emitting device may include a light-emitting structure on a substrate, a buffer layer between the substrate and the light-emitting structure, and a mask layer between the buffer layer and the light-emitting structure. The light-emitting structure may include a first-conductivity-type nitride semiconductor layer on the substrate, an active layer on the first-conductivity-type nitride semiconductor layer, and a second-conductivity-type nitride semiconductor layer on the active layer. The buffer layer may include a plurality of voids, the plurality of voids extending vertically into the buffer layer from a surface of the buffer layer, the surface proximate to the light-emitting structure. The mask layer may include a plurality of openings, each opening of the plurality of openings having a horizontal sectional shape that is a substantially circular shape.

According to some example embodiments, there is provided a light-emitting device. The light-emitting device may include a light-emitting structure on a light-transmissive substrate, a buffer layer between the light-transmissive substrate and the light-emitting structure. The light-emitting structure may include a first-conductivity-type nitride semiconductor layer, an active layer, and a second-conductivity-type nitride semiconductor layer. The buffer layer may include a plurality of voids, the plurality of voids extending vertically into the buffer layer from a surface of the buffer layer, the surface proximate to the light-emitting structures, the plurality of voids having different horizontal sectional areas. The light-emitting device may include a first electrode on the first-conductivity-type nitride semiconductor layer, the first electrode coupled to the first-conductivity-type nitride semiconductor layer. The light-emitting device may include a second electrode on the second-conductivity-type nitride semiconductor layer, the second electrode coupled to the second-conductivity-type nitride semiconductor layer.

BRIEF DESCRIPTION OF THE DRAWINGS

Embodiments of the inventive concepts will be more clearly understood from the following detailed description taken in conjunction with the accompanying drawings in which:

FIGS. 4A, 4B, 4C, 4D, 4E, 4E, 4F, 4G, and 4H are cross-sectional views of a method of manufacturing a light-emitting device according to some example embodiments;

FIGS. 6A, 6B, and 6C are cross-sectional views of a method of manufacturing a light-emitting device according to some example embodiments;

DETAILED DESCRIPTION OF THE EMBODIMENTS

Figure 1A:
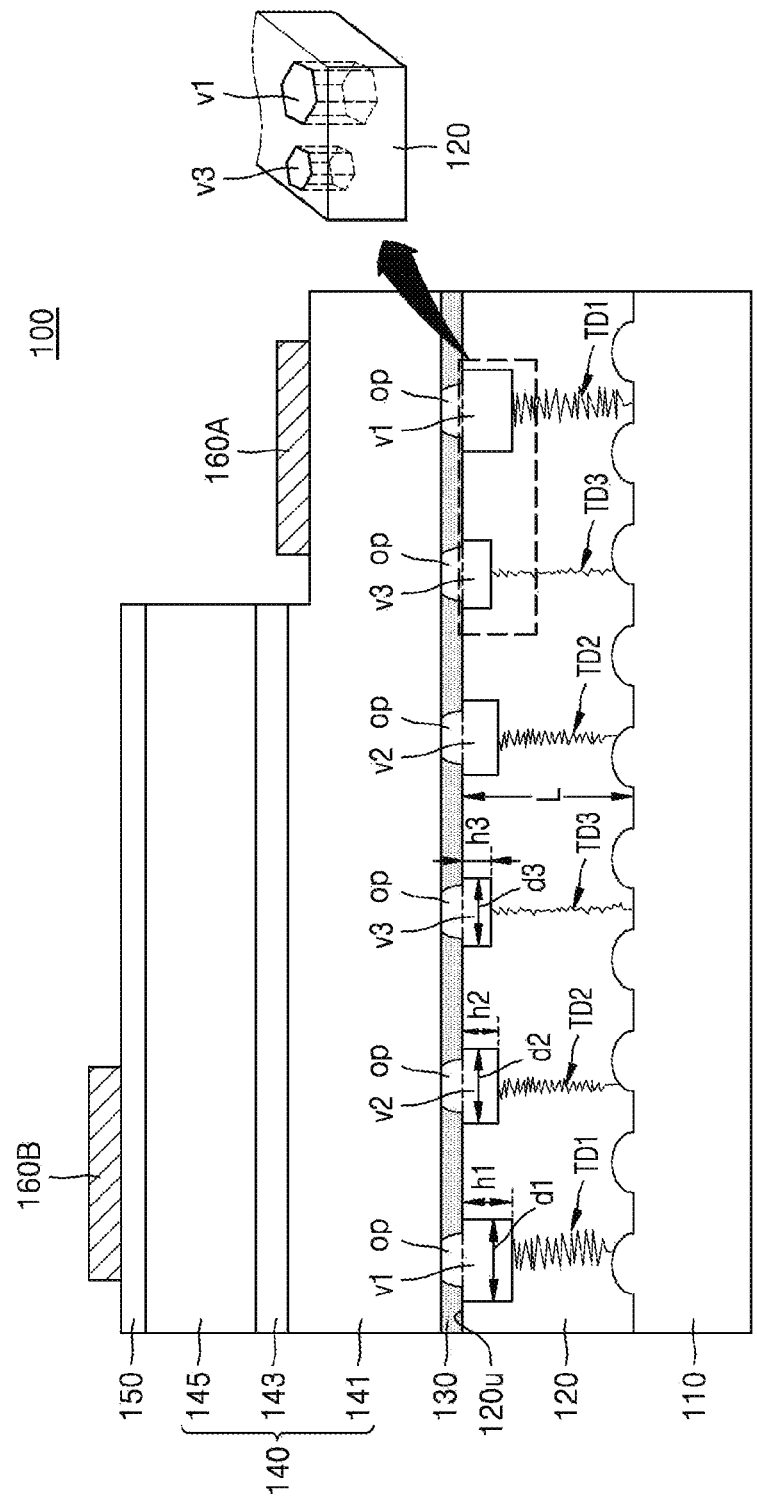
FIGS. 1A and 1B are cross-sectional views of a light-emitting device according to some example embodiments.

FIG. 1A is a cross-sectional view of a light-emitting device 100 according to some example embodiments.

Referring to FIG. 1A, the light-emitting device 100 may include a substrate 110, a buffer layer 120, a mask layer 130, a light-emitting structure 140, an ohmic contact layer 150, a first electrode 160A on the first-conductivity-type semiconductor layer 141 and coupled ("connected") to the first-conductivity-type semiconductor layer 141, and a second electrode 160B on the second-conductivity-type semiconductor layer 145 and coupled ("connected") to the second-conductivity-type semiconductor layer 145. The light-emitting structure 140 may include a first-conductivity-type semiconductor layer 141, an active layer 143, and a second-conductivity-type semiconductor layer 145. As shown, the first-conductivity-type semiconductor layer 141 may be on substrate 110, the active layer 143 may be on the first-conductivity-type semiconductor layer 141 and distal from the substrate 110 in relation to the first-conductivity-type semiconductor layer 141, and the second-conductivity-type semiconductor layer 145 may be on the active layer 143 and distal from the substrate 110 in relation to the active layer 143 and the first-conductivity-type semiconductor layer 141. A first-conductivity-type semiconductor layer 141 may be a first-conductivity-type nitride semiconductor layer, and the second-conductivity-type semiconductor layer 145 may be a second-conductivity-type nitride semiconductor layer.

According to some example embodiments, the substrate 110 may include an insulating material, a conductive material, or a semiconductor material. According to some example embodiments, the substrate 110 may include at least one of sapphire, silicon carbide (SiC), silicon (Si), magnesium aluminum oxide ($MgAl_2O_4$), magnesium oxide (MgO), lithium aluminum oxide ($LiAlO_2$), lithium gallium oxide ($LiGaO_2$), and gallium nitride (GaN). According to some example embodiments, the substrate 110 may be a semiconductor growth substrate. The substrate 110 may be a light-transmissive substrate.

When the substrate 110 includes silicon (Si), the substrate 110 may be suitable for scaling-up and relatively low-priced to improve mass productivity. When the light-emitting structure 140 is formed on the substrate 110 including silicon, a strong electric field may be formed in the active layer 143 due to tensile stress caused by a difference in lattice constant.

When the substrate 110 includes sapphire, the substrate 110 may be an electrical insulating substrate including crystals having hexa-Rhombo (R3c) symmetry. The substrate 110 may have a c-axial lattice constant and an a-axial lattice constant of about 13.001 Å and 4.758 Å, respectively, and have crystal planes, such as a plane C (0001), a plane A (1120), and a plane R (1102). In this case, the plane C may relatively facilitate growth of a nitride thin film and be stable at a high temperature. When the light-emitting structure 140 is grown along the c-axis, an electric field may be formed in the active layer 143 due to tensile stress caused by a difference in lattice constant.

According to some example embodiments, the substrate 110 may be partially or completely removed to improve light output and/or electrical characteristics before or after the light-emitting structure 140 is grown. When the substrate 110 includes sapphire, the substrate 110 may be removed by allowing laser beams to be transmitted through the substrate 110 and irradiated to an interface between the light-emitting structure 140 and the substrate 110. When the substrate 110 includes silicon or silicon carbide, the substrate 110 may be removed by using polishing and etching processes.

According to some example embodiments, light extraction efficiency of the light-emitting structure 140 may be improved by forming a concave-convex pattern on one surface or a side surface of the substrate 110. A size of the concave-convex pattern may be selected in a range of about 5 nm to about 500 μm. The concave-convex pattern may be a regular or irregular pattern and include one of various shapes, such as a pillar shape, a dome shape, or a hemispherical shape. However, the inventive concepts is not limited thereto. According to some example embodiments, the substrate 110 may not include the concave-convex pattern.

A buffer layer 120 may be located on the substrate 110. As shown, the buffer layer 120 may be between the substrate 110 and the light-emitting structure 140. The buffer layer 120 may reduce a difference in lattice constant between the substrate 110 and the first-conductivity-type semiconductor layer 141 stacked on the substrate 110 and including gallium nitride (GaN), thereby alleviating lattice defects of the light-emitting structure 140 and increasing crystallinity. According to some example embodiments, a lower portion of the buffer layer 120 may have a higher defect density than an upper portion thereof. According to some example embodiments, the buffer layer 120 may include an undoped semiconductor material including nitride.

According to some example embodiments, the buffer layer 120 may include $Al_xIn_yGa_{1-x-y}N$ (here, $0 \leq x \leq 1$ and $0 \leq y \leq 1$). According to some example embodiments, the buffer layer 120 may include undoped GaN, undoped AlN, or undoped InGaN. According to some example embodiments, the buffer layer 120 may be grown to a thickness of several tens of Å to several hundred Å at a temperature of about 400° C. to about 800° C. or a temperature of about 500° C. to about 600° C.

According to some example embodiments, when the substrate 110 includes sapphire, the buffer layer 120 may include AlN, AlGaN, or InGaN. According to some example embodiments, the buffer layer 120 may include a material, such as $ZrB_2$, $HfB_2$, ZrN, HfN, or TiN. According to some example embodiments, the buffer layer 120 may include a plurality of layers or a layer having a graded composition.

Here, an undoped semiconductor layer may refer to a semiconductor layer on which an impurity doping process is not performed. In this case, the semiconductor layer may include an original concentration of impurities. For example, when a gallium nitride semiconductor is grown by using a metal organic chemical vapor deposition (MOCVD) process, even if not intended, silicon used as a dopant may be contained in the gallium nitride semiconductor layer at a concentration of about $10^{14}/cm^2$ to about $10^{18}/cm^2$.

According to some example embodiments, when the substrate 110 includes sapphire, since a difference in coefficient of thermal expansion (CTE) between silicon and GaN is higher than a difference in CTE between sapphire and GaN and silicon has a lower CTE than GaN, the buffer layer 120 may provide compressive stress to compensate for the CTE characteristics of silicon.

According to some example embodiments, the buffer layer 120 may have a composite structure including a plurality of layers. Thus, the buffer layer 120 may inhibit warpage of the substrate 110. According to some example embodiments, at least a portion of the buffer layer 120 may include low-density Ga. According to some example embodiments, at least a portion of the buffer layer 120 may not include Ga. According to some example embodiments, a lower portion of the buffer layer 120 may include low-density Ga. According to some example embodiments, the lower portion of the buffer layer 120 may not include Ga. According to some example embodiments, the buffer layer 120 may include a material, such as SiC, SiGe, or AlN.

According to some example embodiments, the buffer layer 120 may include a plurality of threading dislocations, for example, first to third threading dislocations TD1, TD2, and TD3. The first threading dislocations TD1 may be screw dislocations. The second threading dislocations TD2 may be mixed dislocations, which are mixtures of screw dislocations and edge dislocations. The third threading dislocations TD3 may be edge dislocations.

In general, a dislocation may be explained by a dislocation line and a Burgers vector. The dislocation line may indicate a direction in which a dislocation proceeds. Edge dislocation lines may be lines extending along ends of extra half planes of atoms, while screw dislocation lines may be lines extending along the centers of screw shapes. The Burgers vector may indicate a magnitude and a direction of distortion of a lattice.

Here, edge dislocations may be defects obtained by introducing extra half planes of atoms in the middle of lattice structures and distorting planes of the atoms in the lattice structures. In the edge dislocations, a Burgers vector may be perpendicular to a dislocation line direction, and a direction in which a plane of a lattice slides may be perpendicular to a dislocation line. In the edge dislocations, interatomic bonds may have large distortions only in the vicinities of dislocations.

Screw dislocations may be dislocations in which deformed atomic planes, which are planes formed by relative positions of atoms present in the vicinities of dislocation lines, have screw shapes around the dislocation lines. In this case, the deformation of lattices may occur in a direction parallel to the dislocation lines, and the Burgers vector may be parallel to the dislocation lines. In the screw dislocations, interatomic bonds may have distortions in a wider range than in the edge dislocations.

As described above, mixed dislocations may be mixtures of the edge dislocations and the screw dislocations and have both screw dislocation characteristics and edge dislocation characteristics. Burgers vectors of the mixed dislocations may be neither perpendicular nor parallel to dislocation lines.

As shown in at least FIG. 1A, the buffer layer 120 may include a plurality of voids, the plurality of voids v1, v2, and v3, also referred to herein as first to third voids v1, v2, and v3. The first to third voids v1, v2, and v3, as shown in FIG. 1A, may extend vertically (e.g., orthogonally to a surface 120u of the buffer layer 120) into the buffer layer 120 (e.g., into an interior of the buffer layer 120) from the surface 120u of the buffer layer 120. As shown in FIG. 1A, the surface 120u of buffer layer 120 may be proximate to the light-emitting structure 140, and the plurality of voids (first to third voids v1, v2, and v3) may have different horizontal sectional areas (where horizontal is understood to refer to a direction that is parallel to at least the surface 120u of the buffer layer 120).

For example, first voids v1 may have a first horizontal sectional area, second voids v2 may have a second horizontal sectional area, the second horizontal sectional area less than the first horizontal sectional area, and third voids v3 may have a third horizontal sectional area, the third horizontal sectional area less than the second horizontal sectional area.

According to some example embodiments, first to third voids v1, v2, and v3 may be located on the first to third threading dislocations TD1, TD2, and TD3. Restated, the plurality of threading dislocations TD1, TD2, and TD3 may include first threading dislocations TD1 corresponding to the first voids v1, second threading dislocations TD2 corresponding to the second voids v2, and third threading dislocations TD3 corresponding to the third voids v3.

According to some example embodiments, the first to third voids v1, v2, and v3 may have structures that are depressed into the buffer layer 120 from a top surface of the buffer layer 120 (e.g., surface 120u), which is spaced apart from ("isolated from direct contact with") the substrate 110. According to some example embodiments, the first to third voids v1, v2, and v3 may have a hexagonal pillar shape.

According to some example embodiments, at least some of the first voids v1 may be aligned with the first threading dislocations TD1. According to some example embodiments, at least some of the second voids v2 may be aligned with the second threading dislocations TD2. According to some example embodiments, at least some of the third voids v3 may be aligned with the third threading dislocations TD3. According to some example embodiments, some of the first to third voids v1, v2, and v3 may not be aligned with the first to third threading dislocations TD1, TD2, and TD3. According to some example embodiments, some of the first to third threading dislocations TD1, TD2, and TD3 may not be aligned with the first to third voids v1, v2, and v3. According to some example embodiments, the first to third voids v1, v2, and v3 may be formed at a density of about $5 \cdot 10^7/cm^2$ to about $1 \cdot 10^8/cm^2$, but the inventive concepts is not limited thereto. According to some example embodiments, the first to third voids v1, v2, and v3 may be formed to various sizes such that a distance between opposite surfaces of a hexagonal pillar of each of the first to third voids v1, v2, and v3, except a bottom surface and a top surface thereof, ranges from about 500 nm to about 1.5 μm. However, the inventive concepts are not limited thereto.

Distances between the opposite surfaces of hexagonal pillars of the first to third voids v1, v2, and v3, except bottom surfaces and top surfaces thereof, may be referred to as first to third lengths d1, d2, and d3, respectively. Also, heights of the first to third voids v1, v2, and v3 may be referred to as first to third heights h1, h2, and h3, respectively. The first voids v1 may have a first height h1, the second voids v2 may have a second height h3, the second height h2 being less than the first height h1, and the third voids v3 may have a third height h3, the third height h3 being less than the second height h2.

In some example embodiments, the first to third lengths (also referred to herein as "horizontal lengths," "widths," or the like) d1, d2, and d3 may be different from one another. The first length d1 may be greater than the second length d2. In some example embodiments, the second length d2 may be greater than the third length d3. In some example embodiments, the first length d1 may be greater than the third length d3.

In some example embodiments, the first to third heights (also referred to herein as "vertical heights," "vertical lengths," or the like) h1, h2, and h3 may be different from one another. In some example embodiments, the first height h1 may be greater than the second height h2. In some example embodiments, the second height h2 may be greater than the third height h3. In some example embodiments, the first height h1 may be greater than the third height h3. In some example embodiments, the first to third heights h1, h2, and h3, may be substantially common (e.g., common within manufacturing tolerances and/or material tolerances). Restated, the plurality of voids may have substantially common heights. As shown in FIG. 1A, the plurality of voids v1, v2, and v3 may have heights h1, h2, and h3 that are less than a vertical length L of the buffer layer 120.

According to some example embodiments, horizontal sectional areas of the first to third voids v1, v2, and v3 may be different from one another. According to some example embodiments, the horizontal sectional area of the first voids v1 may be greater than the horizontal sectional area of the second voids v2. According to some example embodiments, the horizontal sectional area of the second voids v2 may be greater than the horizontal sectional area of the third voids v3.

According to some example embodiments, volumes of first to third voids v1, v2, and v3 may be different from one another. According to some example embodiments, the volume of the first voids v1 may be greater than the volume of the third voids v3. According to some example embodiments, the volume of the second voids v2 may be greater than the volume of the third voids v3. According to some example embodiments, the volume of the first voids v1 may be greater than the volume of the third voids v3.

According to some example embodiments, the first to third voids v1, v2, and v3 may not be located on some of the first to third threading dislocations TD1, TD2, and TD3. According to some example embodiments, the first to third threading dislocations TD1, TD2, and TD3 may not be located on some of the first to third voids v1, v2, and v3. According to some example embodiments, the number of the first to third threading dislocations TD1, TD2, and TD3 may be more than the number of the first to third voids v1, v2, and v3. According to some example embodiments, the number of the first to third threading dislocations TD1, TD2, and TD3 may be equal to or less than the number of the first to third voids v1, v2, and v3.

In the light-emitting device 100 according to some example embodiments, the buffer layer 120 between the light-emitting structure 140 and substrate 110 may include a porous structure having the first to third voids v1, v2, and v3. As described below, the porous structure may cause the scattering of light in the light-emitting device 100 and increase extraction efficiency for light generated by the active layer 143, as described below. Also, the porous structure may mitigate stress present in gallium nitride and thus, reduce residual stress transmitted to the active layer 143. Furthermore, since the first to third threading dislocations TD1, TD2, and TD3 are blocked by the first to third voids v1, v2, and v3, the density of threading dislocations may be reduced.

A mask layer 130 may be located on the buffer layer 120, such that the mask layer 130 is between the buffer layer 120 and the light-emitting structure 140. According to some example embodiments, the mask layer 130 may have a high etch selectivity with respect to the buffer layer 120. According to some example embodiments, the mask layer 130 may have a wurzite crystal structure. According to some example embodiments, the mask layer 130 may include a metal. According to some example embodiments, the mask layer 130 may include aluminum (Al). According to some example embodiments, the mask layer 130 may include a metal nitride. According to some example embodiments, the mask layer 130 may include aluminum nitride. According to some example embodiments, the mask layer 130 may have a thickness of several tens of nm or less. According to some example embodiments, the mask layer 130 may have a thickness of several nm.

The mask layer 130 may include a plurality of openings 'op' exposing at least portions of the buffer layer 120. According to some example embodiments, a height of the plurality of openings 'op' may be equal to a thickness of the mask layer 130. According to some example embodiments, the plurality of openings 'op' may penetrate the mask layer 130. According to some example embodiments, a horizontal sectional area each opening of the plurality of openings 'op' may be less than a horizontal sectional area of the first to third voids v1, v2, and v3. According to some example embodiments, the maximum horizontal sectional area of the plurality of openings 'op' may be less than the horizontal sectional areas of the first to third voids v1, v2, and v3. According to some example embodiments, each opening of the plurality of openings 'op' may have a hemispherical dome shape having a cut upper portion. According to some example embodiments, a horizontal sectional shape of each opening of the plurality of openings 'op' may have a substantially circular shape (e.g., a circular shape within manufacturing tolerances and/or material tolerances). According to some example embodiments, the horizontal sectional areas of the plurality of openings 'op' may be greater toward the buffer layer 120. According to some example embodiments, the plurality of openings 'op' may vertically overlap the first to third voids v1, v2, and v3. According to some example embodiments, the plurality of openings 'op' may be aligned with the first to third voids v1, v2, and v3.

The light-emitting structure 140 may be located on the mask layer 130. The light-emitting structure 140 may include the first-conductivity-type semiconductor layer 141, the active layer 143, and the second-conductivity-type semiconductor layer 145, which are sequentially stacked. According to some example embodiments, the light-emitting structure 140 may be mesa-etched to expose a portion of a top surface of the first-conductivity-type semiconductor layer 141.

According to some example embodiments, the first-conductivity-type semiconductor layer 141 may include single crystalline nitride having a composition of $Al_xIn_yGa_{1-x-y}N$ ($0 \le x \le 1$, $0 \le y \le 1$, and $0 \le x+y \le 1$). The first-conductivity-type semiconductor layer 141 may include an n-type doped semiconductor. According to some example embodiments, the first-conductivity-type semiconductor layer 141 may include silicon (Si)-doped GaN.

The first-conductivity-type semiconductor layer 141 may function as a contact layer and include a relatively high concentration of impurities to reduce a contact resistance. According to some example embodiments, the first-conductivity-type semiconductor layer 141 may have an n-type dopant concentration of about $2 \times 10^{18}/cm^2$, but is not limited thereto.

The first-conductivity-type semiconductor layer 141 may have a monolayered structure having the same composition or have a multilayered structure having different compositions or thicknesses as needed. According to some example embodiments, the first-conductivity-type semiconductor layer 141 may further include an electron injection layer capable of improving electron injection efficiency.

The active layer 143 may be located on the first-conductivity-type semiconductor layer 141. The active layer 143 may have a lower energy bandgap than the first- and second-conductivity-type semiconductor layers 141 and 145. The active layer 143 may emit light having particular (or, alternatively, predetermined) energy due to recombination between electrons and holes. According to some example embodiments, the active layer 143 may emit, for example, infrared light, visible light, or ultraviolet light. The active layer 143 may include $Al_xIn_yGa_{1-x-y}N$ ($0 \leq x \leq 1$, $0 \leq y \leq 1$, and $0 \leq x+y \leq 1$), for example, InGaN or AlGaN.

According to some example embodiments, the active layer 143 may have any one of a single well structure, a multiple well structure, a single quantum well (SQW) structure, a multiple quantum well (MQW) structure, a quantum dot structure, or a quantum wire structure.

According to some example embodiments, the active layer 143 may include an MQW structure obtained by alternately stacking QW layers (not shown) and quantum barrier layers (not shown). In this case, a thickness of each of the QW layers and the quantum barrier layers may range from about 3 nm to about 10 nm. The number of QW layers and the number of quantum barrier layers may be variously changed according to design conditions. According to some example embodiments, the MQW structure may include any one of an InGaN/GaN MQW structure and a GaN/AlGaN/GaN MQW structure. The active layer 143 may emit blue light when the active layer 143 has an indium (In) content of, for example, about 22%, and emit green light when the active layer 143 has an In content of, for example, about 40%, but the inventive concepts is not limited thereto.

According to some example embodiments, a superlattice layer may be located between the first-conductivity-type semiconductor layer 141 and the active layer 143. According to some example embodiments, the superlattice layer may include a plurality of QW layers and a plurality of quantum barrier layers, which are alternately and repetitively stacked. According to some example embodiments, a thickness of the QW layers included in the superlattice layer may be less than a thickness of the quantum barrier layers included in the superlattice layer. According to some example embodiments, the thickness of the QW layers included in the superlattice layer may range from about 0.5 nm to about 2 nm, and the thickness of the quantum barrier layers included in the superlattice layer may range from about 0.5 nm to about 10 nm. According to some example embodiments, the QW layers may include InGaN, while the quantum barrier layers may include GaN. According to some example embodiments, silicon (Si) may be further doped into the QW layers.

According to some example embodiments, the superlattice layer may spread electrons injected from a first electrode 160A, as described below, in a lateral direction and improve uniformity of current. Furthermore, the superlattice layer may mitigate an internal electric field due to compressive stress applied to the QW layers included in the active layer 143. An electron spreading effect may be enhanced by increasing an In content of the QW layers of the superlattice layer. However, when the In content of the QW layers exceeds a particular (or, alternatively, predetermined) value, defects may occur in the superlattice layer due to a difference in lattice constant between the QW layers and the quantum barrier layers.

The second-conductivity-type semiconductor layer 145 may include a single crystalline nitride having a composition of p-type doped $Al_xIn_yGa_{1-x-y}N$ ($0 \leq x \leq 1$, $0 \leq y \leq 1$, and $0 \leq x+y \leq 1$). According to some example embodiments, zinc (Zn), cadmium (Cd), beryllium (Be), magnesium (Mg), calcium (Ca), and/or barium (Ba) may be doped into the second-conductivity-type semiconductor layer 145.

A portion of the second-conductivity-type semiconductor layer 145 adjacent to the active layer 143 may further include a current cutoff layer (not shown). According to some example embodiments, the current cutoff layer (not shown) may have a stack structure of a plurality of layers including different compositions of $Al_xIn_yGa_{1-x-y}N$ ($0 \leq x < 1$, $0 \leq y < 1$, and $0 \leq x+y < 1$) or a monolayered structure or double structure including $Al_zGa_{1-x}N$ ($0 \leq z < 1$). According to some example embodiments, a bandgap of the current cutoff layer may be higher than a bandgap of a QW structure included in the active layer 143. According to some example embodiments, the current cutoff layer may prevent electrons from migrating from the active layer 143 to the second-conductivity-type semiconductor layer 145. Thus, the probability that electrons and holes recombine in the active layer 143 may be increased.

An ohmic contact layer 150 may be located on the second-conductivity-type semiconductor layer 145. According to some example embodiments, the ohmic contact layer 150 may be a single crystalline nitride semiconductor layer having a composition of p-type doped $Al_xIn_yGa_{1-x-y}N$ ($0 \leq x \leq 1$, $0 \leq y \leq 1$, $0 \leq x+y \leq 1$). According to some example embodiments, the ohmic contact layer 150 may have a higher dopant concentration than the second-conductivity-type semiconductor layer 145. An ohmic contact resistance of the ohmic contact layer 150 may be reduced by comparatively increasing a dopant concentration of the ohmic contact layer 150 so that an operating voltage of the light-emitting device 100 may be reduced and device characteristics may be improved.

According to some example embodiments, the light-emitting device 100 shown in FIG. 1A may have a flip-chip structure in which first and second electrodes 160A and 160B are located in an opposite direction to a light extraction surface of the light-emitting device 100. In this case, the ohmic contact layer 150 may have a high reflective material. According to some example embodiments, the ohmic contact layer 150 may have a monolayered structure or a multilayered structure including at least one selected from the group consisting of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au). Also, the ohmic contact layer 150 may further include GaN, InGaN, ZnO, or graphene.

The light-emitting device 100 may include first and second electrodes 160A and 160B, which are formed on an exposed region of the first-conductivity-type semiconductor layer 141 and a region of the ohmic contact layer 150, respectively. According to some example embodiments, the first and second electrodes 160A and 160B may include a conductive material. According to some example embodiments, the first and second electrodes 160A and 160B may include a material, such as Ag, Ni, Al, Rh, Pd, Ir, Ru, Mg, Zn, Pt, and Au. According to some example embodiments, each of the first and second electrodes 160A and 160B may have at least a double structure including Ni/Ag, Zn/Ag, Ni/Al, Zn/Al, Pd/Ag, Pd/Al, Ir/Ag. Ir/Au, Pt/Ag, Pt/Al, or Ni/Ag/Pt.

Figure 1B:
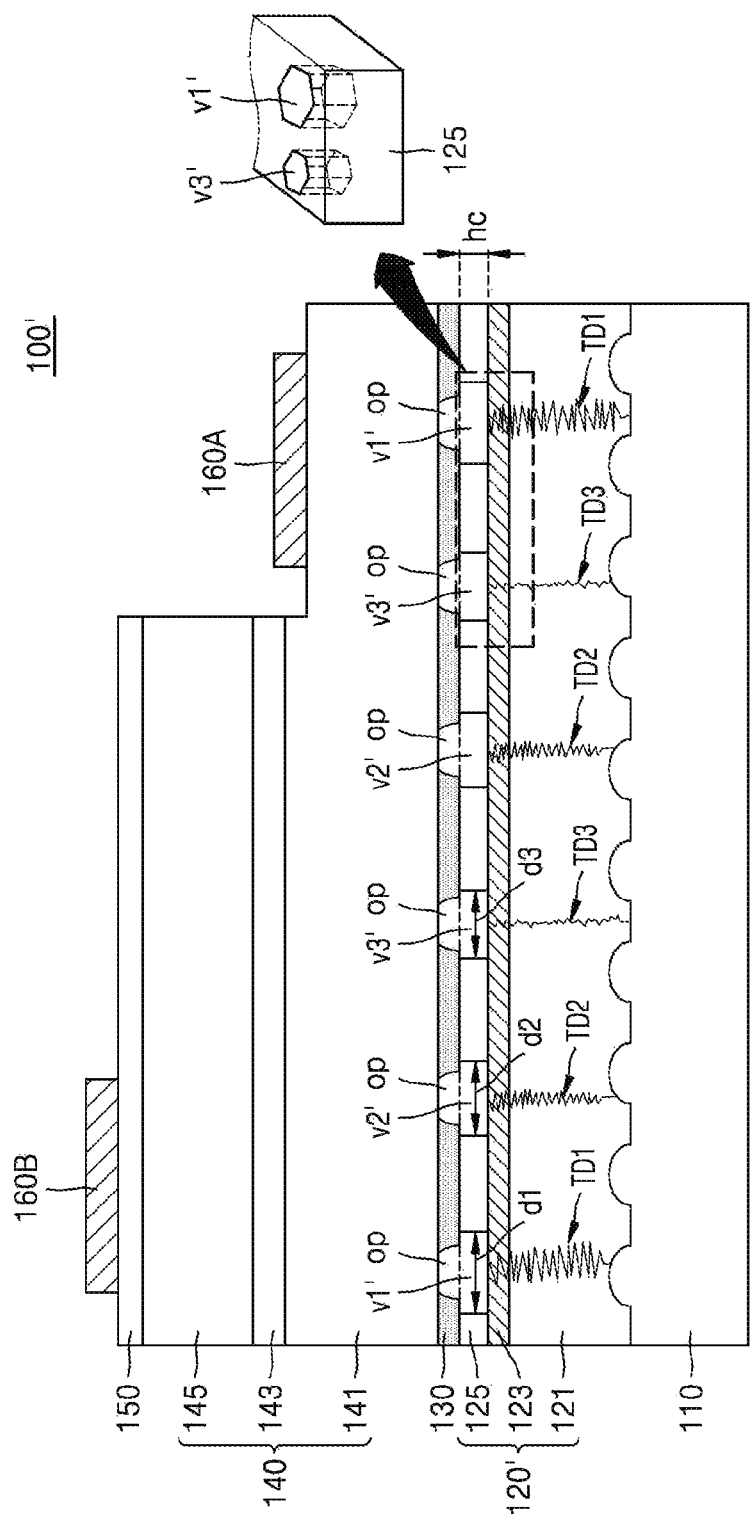

FIG. 1B is a cross-sectional view of a light-emitting device 100' according to some example embodiments.

For brevity, the same descriptions as with reference to FIG. 1A will be omitted in FIG. 1B, and differences therebetween will mainly be described.

Referring to FIG. 1B, a buffer layer 120' may be disposed on a substrate 110. According to some example embodiments, the buffer layer 120' may include a plurality of layers. According to some example embodiments, the buffer layer 120' may include a lower buffer layer 121, an etch stop layer 123, and an upper buffer layer 125, which are sequentially stacked. The lower buffer layer 121 may be referred to herein as a first nitride semiconductor layer. The upper buffer layer 125 may be referred to herein as a second nitride semiconductor layer. The lower buffer layer 121 and the upper buffer layer 125 may include substantially the same material as the buffer layer 120 described with reference to FIG. 1A. According to some example embodiments, the etch stop layer 123 may include a metal. According to some example embodiments, the etch stop layer 123 may include aluminum (Al). According to some example embodiments, the etch stop layer 123 may include aluminum gallium nitride (AlGaN).

According to some example embodiments, a plurality of threading dislocations, for example, first to third threading dislocations TD1, TD2, and TD3, may be formed on the buffer layer 120. The first threading dislocations TD1 may be screw dislocations. The third threading dislocations TD3 may be edge dislocations. The second threading dislocations TD2 may be mix dislocations, which are mixtures of the first threading dislocations TD1 and the third threading dislocations TD3.

The first to third threading dislocations TD1, TD2, and TD3 may extend from the lower buffer layer 121 and the etch stop layer 123. Restated, the first to third threading dislocations TD1, TD2, and TD3 (e.g., a plurality of threading dislocations) may extend in a "perpendicular direction." The first to third threading dislocations may overlap at least portions of the plurality of openings 'op.'

According to some example embodiments, first to third voids v1', v2', and v3' may be located on the first to third threading dislocations TD1, TD2, and TD3. According to some example embodiments, the first to third voids v1', v2', and v3' may penetrate the upper buffer layer 125 and expose portions of a top surface of the etch stop layer 123, but the inventive concepts is not limited thereto. According to some example embodiments, the first to third voids v1', v2', and v3' may have a hexagonal pillar shape.

Here, definitions of the first to third lengths d1, d2, and d3 may be substantially the same as in FIG. 1A. In some example embodiments, the first to third lengths d1, d2, and d3 may be different from one another. The first length d1 may be greater than the second length d2. In some example embodiments, the second length d2 may be greater than the third length d3. In some example embodiments, the first length d1 may be greater than the third length d3.

In some example embodiments, the first to third voids v1', v2', and v3' may have substantially the same height, that is, a common height 'hc'. In some example embodiments, the common height 'hc' may be substantially equal to a height of the upper buffer layer 125.

Figure 2A:
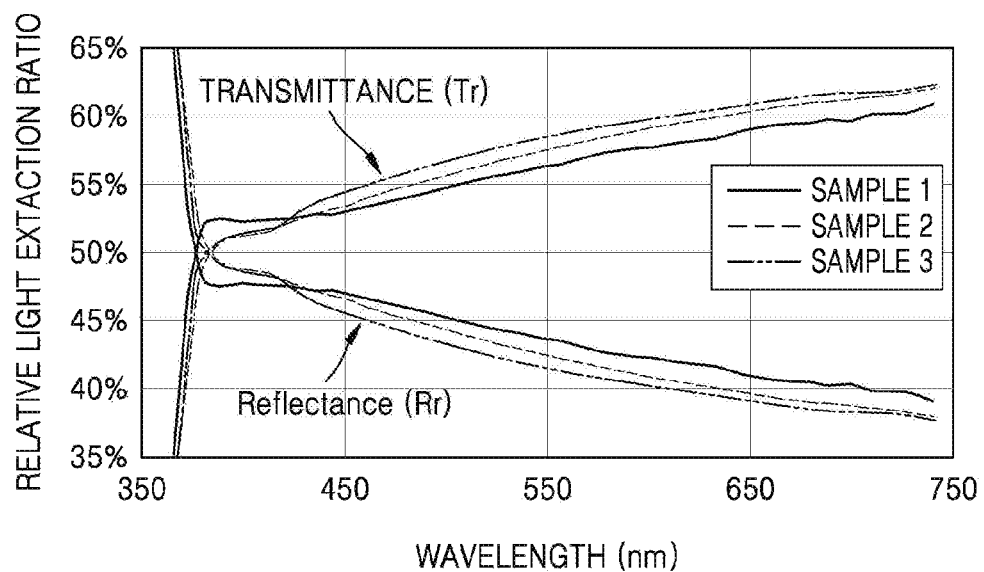
FIGS. 2A, 2B, and 2C are graphs showing effects of a light-emitting device according to some example embodiments.
Figure 2B:
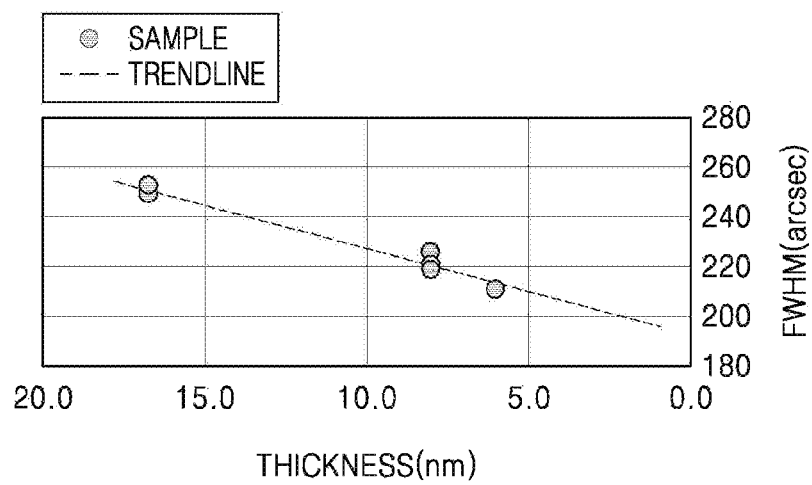
Figure 2C:
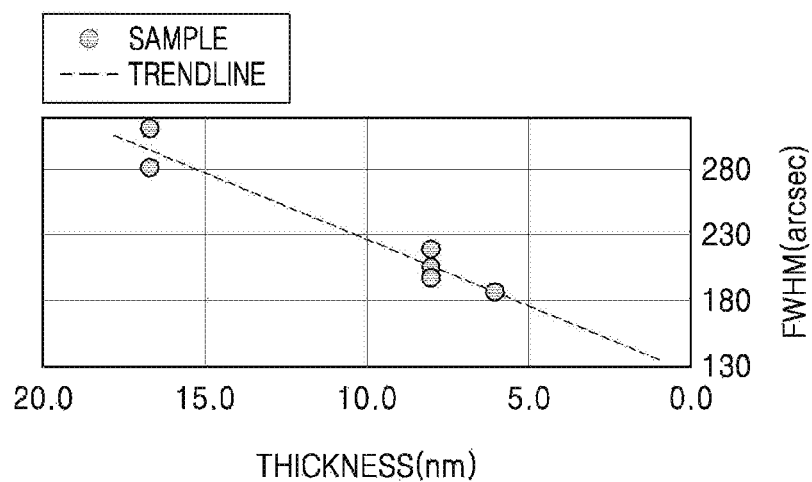

FIGS. 2A, 2B, and 2C are graphs showing effects of a light-emitting device according to some example embodiments.

FIG. 2A is a graph showing analysis results of optical characteristics of first to third experimental examples 'Sample 1', 'Sample 2', and 'Sample 3' including buffer layers in which voids are formed at different densities. In first to third experimental examples 'Sample 1', 'Sample 2', and 'Sample 3', a workpiece serving as a measurement object may be a wafer-level workpiece on which an ohmic material layer 150p is provided but a singulation process is not performed as shown below in FIG. 4H. With respect to first to third experimental examples 'Sample 1', 'Sample 2', and 'Sample 3', light traveling from a light-emitting structure toward a substrate was irradiated to the light-emitting structure, and a reflectance and a transmittance of the light were measured.

A void density of first experimental example 'Sample 1' was lower than a void density of second experimental example 'Sample 2'. The void density of second experimental example 'Sample 2' was lower than a void density of third experimental example 'Sample 3'. Here, voids may be the first to third voids v1, v2, and v3 described with reference to FIG. 1A or the first to third voids v1', v2', and v3' described with reference to FIG. 1B.

Referring to FIG. 2A, it can be seen that as the density of a porous structure increases, a ratio of reflected light in the total transmitted/reflected light may be reduced, while a ratio of transmitted light may increase. The results of FIG. 2A may be obtained due to the fact that due to Mie scattering caused by the porous structure, incident light is scattered in the same direction as a direction in which the incident light initially proceeds so that extraction efficiency of light traveling toward the substrate may increase. Here, Mie scattering may refer to the scattering of an electromagnetic wave due to spherical particles whose diameter is similar to or greater than the wavelength of the incident light. According to the present experimental examples, it can be seen that the scattering of light occurs in the light-emitting device because the light-emitting device includes the buffer layer having a plurality of voids, and as the density of the voids increases, light extraction efficiency is further improved.

FIGS. 2B and 2C illustrate a full width at half maximum (FWHM) value of a ω rocking curve of a high-resolution X-ray diffraction pattern relative to a thickness of the mask layer (refer to 130 in FIG. 1A). FIG. 2B shows a ω rocking curve of a high-resolution X-ray diffraction pattern of a crystal plane (002), and FIG. 2C shows a ω rocking curve of a high-resolution X-ray diffraction pattern of a crystal plane (102).

According to an experimental example, FWHM values of high-resolution X-ray diffraction patterns were measured while fixing an angle between a light source and a measurement object and varying a position of a detector. In FIGS. 2B and 2C, workpieces serving as measurement objects may be similar to those described with reference to FIG. 2A. In general, a ω rocking curve of a resolution X-ray diffraction pattern may follow Lorentzian distribution. In this case, as the density of threading dislocations increases, the integrity of a crystal structure may be reduced and a lattice structure may become irregular so that an FWHM value may increase. Accordingly, the FWHM value of the X-ray diffraction pattern may be highly related with crystallinity of the lattice structure, and the density of threading dislocations may be indirectly inferred from the relation between the FWHM value of the X-ray diffraction pattern and the crystallinity of the lattice structure.

According to an experimental example, in a light-emitting structure devoid of a porous structure, when a density of threading dislocation defects is less than about $2 \cdot 10^8 / cm^2$ or less, FWHM values of a crystal plane (002) and a crystal plane (102) may be 220 arcsec and 210 arcsec, respectively.

Referring to FIGS. 2B and 2C, when the mask layer (refer to 130 in FIG. 1A) having a thickness of about 8 nm or less is provided, it can be seen that FWHMs of a crystal plane (002) and a crystal plane (102) are about 220 seconds and about 210 seconds or less and about 220 seconds or less, respectively. The results of FIGS. 2B and 2C may be obtained due to the fact that the density of threading dislocations is reduced due to the formation of voids.

In contrast, when the mask layer (refer to 130 in FIG. 1A) having a thickness of about 8 nm or more is provided, FWHMs of a crystal plane (002) and a crystal plane (102) are about 220 arcsec or more and about 210 arcsec or more, respectively. As described below, according to some example embodiments, since the mask layer 130 is grown at a relatively low temperature, the mask layer 130 may have poor thin-film quality. When the thickness of the mask layer 130 becomes a particular (or, alternatively, predetermined) value or more, crystal lattice stress may be applied to the first-conductivity-type semiconductor layer (refer to 141 in FIG. 1A) located on the mask layer 130 and thus, the density of threading dislocations of the first-conductivity-type semiconductor layer (refer to 141 in FIG. 1A) may be predicted to increase.

Furthermore, in related art documents (e.g., Optic Express vol. 19, Issue S4, pp. A943-A948 (2011)), an effect of reducing residual stress due to a porous structure in a nitride semiconductor light-emitting structure has been described.

Figure 3A:
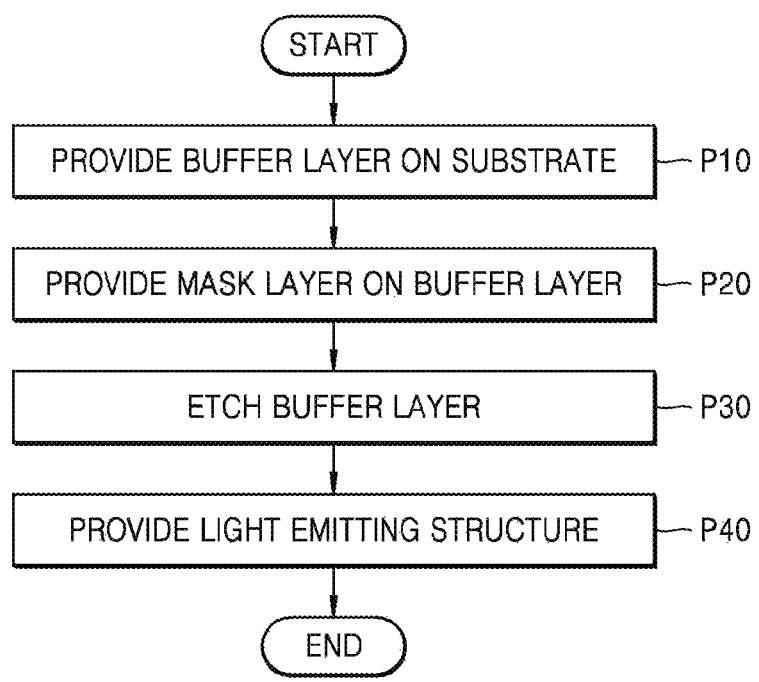
FIGS. 3A, 3B, and 3C are flowcharts of a method of manufacturing a light-emitting device according to some example embodiments.
Figure 3B:
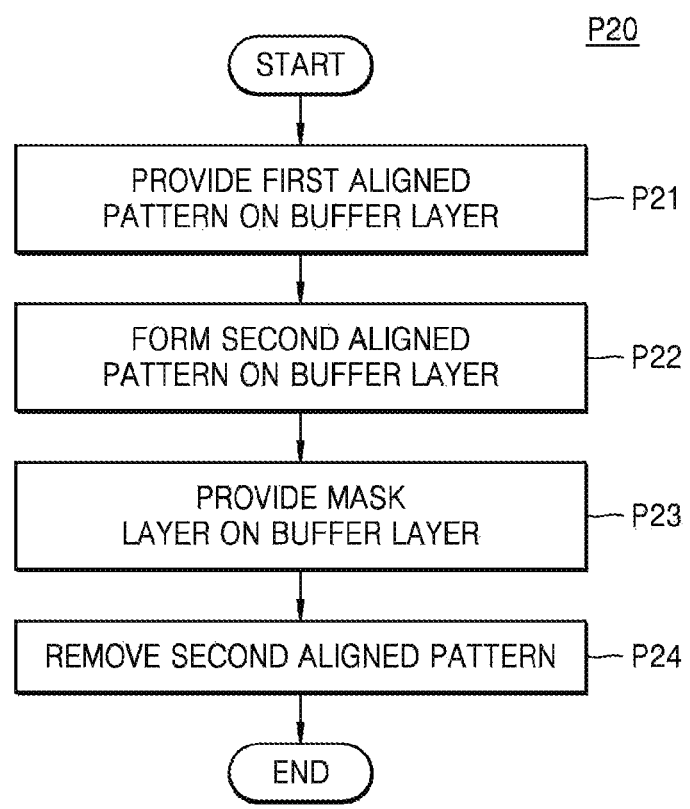
Figure 3C:
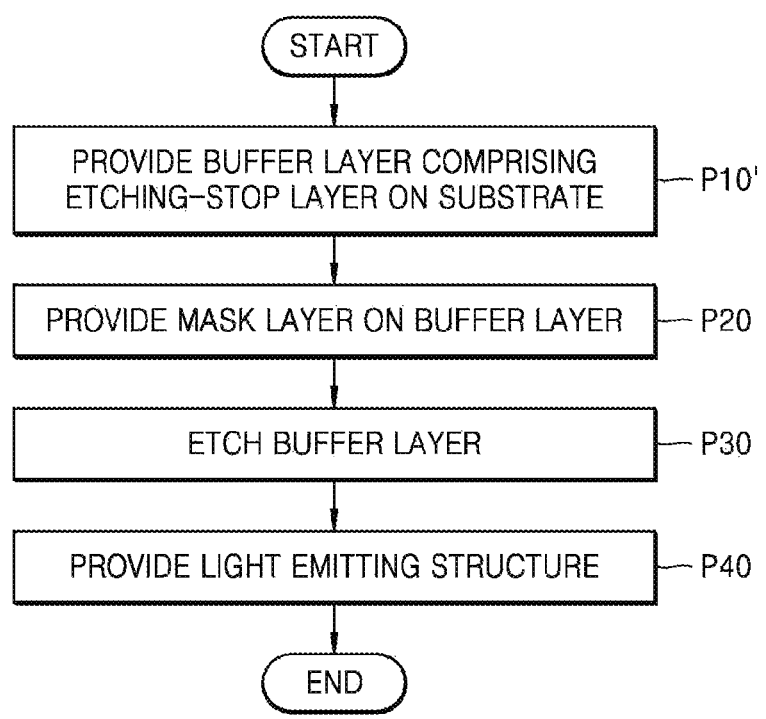

FIGS. 3A, 3B, and 3C are flowcharts of a method of manufacturing a light-emitting device according to some example embodiments.

FIGS. 4A, 4B, 4C, 4D, 4E, 4E, 4F, 4G, and 4H are cross-sectional views of a method of manufacturing a light-emitting device according to some example embodiments.

Referring to FIGS. 3A and 4A, in process P10, a first buffer material layer 120p1 may be provided on a substrate 110.

The substrate 110 may be a growth substrate, and compositions, configurations, and shapes of the substrate 110 may be substantially the same as described with reference to FIG. 1A.

The first buffer material layer 120p1 may include substantially the same composition as the buffer layer 120 described with reference to FIG. 1A. According to some example embodiments, the first buffer material layer 120p1 may be provided by using at least one method of a metal organic chemical vapor deposition (MOCVD) method, a hydride vapor-phase epitaxy (HVPE) method, and a molecular beam epitaxy (MBE) method.

According to some example embodiments, to provide the first buffer material layer 120p1, a small amount of material (e.g., GaN) may be provided to the substrate 110 located in a reactor (e.g., an MOCVD reactor, an HVPE reactor, and an MBE reactor) that is maintained at a low temperature. The provided material may be processed with high-temperature hydrogen and recrystallized, and a GaN-containing material film may be further grown.

According to some other embodiments, a seed layer may be provided by sputtering aluminum nitride (e.g., AlN), and a process of growing a thin film including GaN may be performed. When the aluminum nitride is sputtered, a high-temperature hydrogenation process may be omitted.

According to some example embodiments, the first buffer material layer 120p1 may be provided by stacking a plurality of layers. According to some example embodiments, the first buffer material layer 120p1 may be formed by growing aluminum nitride (e.g., AlN) using an aluminum (Al) source and a nitrogen (N) source at a temperature of about 400° C. to about 1300° C. According to some example embodiments, to form the first buffer material layer 120p1, an undoped GaN layer may be grown on the aluminum nitride layer, for example, an AlN layer. According to some example embodiments, an intermediate layer including a material (e.g., AlGaN) may be further provided to control stress between the AlN layer and the GaN layer. According to some example embodiments, a thickness of the first buffer material layer 120p1 may be about 2 μm to about 5 μm, but is not limited thereto.

According to some example embodiments, a buffer layer 120 may include a plurality of threading dislocations, for example, first to third threading dislocations TD1, TD2, and TD3. The first threading dislocations TD1 may be screw dislocations. The third threading dislocations TD3 may be edge dislocations. The second threading dislocations TD2 may be mixed dislocations, which are mixtures of the first threading dislocations TD1 and the third threading dislocations TD3.

Thereafter, referring to FIG. 3A, in process P20, the first buffer material layer 120p1 may be provided on the substrate 110.

Hereinafter, process P20 will be described in further detail with reference to FIGS. 3B and 4A to 4F.

Referring to FIG. 3B, process P20 may include a process P21 of providing first aligned patterns 131 on the first buffer material layer 120p1, a process P22 of forming second aligned patterns, a process P23 of providing a mask layer, and a process P24 of removing second aligned patterns.

Referring to FIGS. 3B and 4A, in process P21, the first aligned patterns 131 may be provided on the first buffer material layer 120p1. According to some example embodiments, the first aligned patterns 131 may be provided in a reactor, such as an MOCVD reactor, an HVPE reactor, or an MBE reactor in a temperature range of about 400° C. to about 800° C. According to some example embodiments, the first aligned patterns 131 may be provided in a reactor, such as an MOCVD reactor, an HVPE reactor, or an MBE reactor, which is maintained at a temperature of about 640° C. However, the temperature value is only an example that varies according to a state of the reactor, but the inventive concepts is not limited thereto. According to some example embodiments, the first aligned patterns 131 may be provided in a nitrogen (N) atmosphere. According to some example embodiments, the first aligned patterns 131 may include a metal. According to some example embodiments, the first aligned patterns 131 may include indium. According to some example embodiments, the first aligned patterns 131 may include indium nitride (e.g., InN).

According to some example embodiments, the first aligned patterns 131 may have an island shape. According to some example embodiments, each of the first aligned patterns 131 may have a hexagonal symmetry and a hexagonal horn shape with a cut upper portion. According to some example embodiments, the first aligned patterns 131 may be formed at a density similar to that of the first to third threading dislocations TD1, TD2, and TD3. According to some example embodiments, the first aligned patterns 131 may vertically overlap the first to third threading dislocations TD1, TD2, and TD3. According to some example embodiments, the first aligned patterns 131 may be aligned with the first to third threading dislocations TD1, TD2, and TD3. According to some example embodiments, since a size of the first aligned patterns 131 linearly increases with respect to a growth time within a particular (or, alternatively, predetermined) size range, the size of the first aligned patterns 131 may be controlled by adjusting the growth time.

Referring to FIGS. 3B, 4A, and 4B, in process P22, the first aligned patterns 131 may be processed to form second aligned patterns 132. According to some example embodiments, the first aligned patterns 131 may be hydrogenated to form the second aligned patterns 132. According to some example embodiments, the first aligned patterns 131 may be metalized to form the second aligned patterns 132. According to some example embodiments, the formation of the second aligned patterns 132 may include converting an atmospheric gas from nitrogen gas to hydrogen gas in the reactor (e.g., the MOCVD reactor, the HVPE reactor, or the MBE reactor) in which the resultant workpiece is placed.

According to some example embodiments, due to the conversion of the atmospheric gas, the second aligned patterns 132 of which at least portions are in a liquid metal state may be formed by breaking a bond between a metal (e.g., indium (In)) and nitrogen.

According to some example embodiments, at least portions of the second aligned patterns 132 adjacent to surfaces of the second aligned patterns 132 may be in a liquid metal state. According to some example embodiments, at least portions of the second aligned patterns 132 may not be in a liquid state. When the second aligned patterns 132 are completely converted to a liquid state, the second aligned patterns 132 may flow so that the above-described effects of blocking the threading dislocations may be reduced. In addition, the second aligned patterns 132 may be fused together into a lump so that the density of the second aligned patterns 132 may be reduced and the density of first to third voids (refer to FIG. 1A) to be subsequently formed may be reduced.

According to some example embodiments, the second aligned patterns 132 may be liquefied to a particular (or, alternatively, predetermined) depth from surfaces thereof. According to some example embodiments, at least portions of the second aligned patterns 132 may be liquefied so that the second aligned patterns 132 may have a hemispherical dome shape. A horizontal sectional shape of the second aligned patterns 132 may be a substantially circular shape, but is not limited thereto.

Referring to FIGS. 3B and 4C, in process P23, a mask layer 130 may be provided on the first buffer material layer 120p1. According to some example embodiments, the mask layer 130 may include a metal nitride. According to some example embodiments, the mask layer 130 may include aluminum nitride (e.g., AlN). According to some example embodiments, the mask layer 130 may have a high etch selectivity with respect to the second aligned patterns 132 and the first buffer material layer 120p1.

According to some example embodiments, a thickness of the mask layer 130 may be provided in the range of several nm, for example, a range of about 3 nm to about 5 nm. However, a thickness value of the mask layer 130 is only an example and the inventive concepts is not limited thereto in any sense. As described above with reference to FIGS. 2B and 2C, if the mask layer 130 becomes excessively thick, new threading dislocations may be formed on a light-emitting structure formed on the mask layer 130. If the mask layer 130 becomes excessively thin, the mask layer 130 may not serve as a mask protecting at least a portion of underlying layers during the formation of first to third voids (refer to v1, v2, and v3 in FIG. 1A).

According to some example embodiments, a thickness of the mask layer 130 may be lower than a height of the second aligned patterns 132. According to some example embodiments, the mask layer 130 may not be formed on at least portions of the second aligned patterns 132. According to some example embodiments, the mask layer 130 may surround portions of side surfaces of the second aligned patterns 132. According to some example embodiments, the mask layer 130 may cover only portions of surfaces of the second aligned patterns 132. According to some example embodiments, the mask layer 130 may not completely cover the second aligned patterns 132 since at least portions of the second aligned patterns 132 adjacent to surfaces of the second aligned patterns 132 are liquefied and do not have wurzite crystals. Thus, the mask layer 130 may not be grown from the surfaces of the second aligned patterns 132.

Referring to FIGS. 3A, 3B, and 4D, in process P24, the second aligned patterns 132 may be removed.

According to some example embodiments, the second aligned patterns 132 may be removed in-situ in a reactor, such as an MOCVD reactor, an HVPE reactor, and an MBE reactor. According to some example embodiments, second aligned patterns 132 may be removed by using a chemical etching device or a chemical etching station outside a reactor, such as an MOCVD reactor, an HVPE reactor, and an MBE reactor.

The second aligned patterns 132 may be removed by using a wet etching process. According to some example embodiments, the second aligned patterns 132 may be removed by using a wet etching process using an acid as an etchant. According to some example embodiments, the second aligned patterns 132 may be removed by using a wet etching process using nitric acid as an etchant. According to some example embodiments, the second aligned patterns 132 may be removed by using a liquid crystal display etchant (LCE), aqua regia, or nitric acid-based mixed acid.

According to some example embodiments, the second aligned patterns 132 may be removed by using a dry etching process. According to some example embodiments, the second aligned patterns 132 may be sublimated and removed while maintaining the reactor (e.g., an MOCVD reactor, an HVPE reactor, or an MBE reactor) under a low pressure at a constant temperature. According to some example embodiments, after the resultant workpiece is transferred to a particular (or, alternatively, predetermined) chamber capable of providing a high-temperature low-pressure environment, the second aligned patterns 132 may be sublimated and removed.

Thus, a plurality of openings 'op' may be formed in the mask layer 130 to expose portions of a top surface of the first buffer material layer 120p1.

Referring to FIGS. 3A, 4D, and 4E, in process P30, the first buffer material layer 120p1 may be etched to form a second buffer material layer 120p2.

According to some example embodiments, the first buffer material layer 120p1 may be etched by using a dry etching process. According to some example embodiments, the first buffer material layer 120p1 may be etched by using an etching method using a difference between a bond strength between a semiconductor material (e.g., Ga) included in the first buffer material layer 120p1 and nitrogen and bond strength between a metal material (e.g., Al) included in the mask layer 130 and nitrogen. According to some example embodiments, the first buffer material layer 120p1 may be etched in-situ in any one of an MOCVD reactor, an HVPE reactor, and an MBE reactor, which is maintained at a high temperature of about 1000° C. or higher under a low pressure of about 200 torr or lower. According to some example embodiments, after the resultant workpiece is transferred to an electric furnace installed outside the reactor, the first buffer material layer 120p1 may be removed in the electric furnace.

According to some example embodiments, the process of etching the first buffer material layer 120p1 may include changing the atmosphere of the reactor (e.g., the MOCVD reactor, the HVPE reactor, or the MBE reactor) in which the resultant workpiece is located to include hydrogen gas and ammonia gas. According to some example embodiments, when the first buffer material layer 120p1 is etched, the hydrogen gas and the ammonia gas may have a particular (or, alternatively, predetermined) partial pressure. According to some example embodiments, when the first buffer material layer 120p1 is etched, a partial pressure of the hydrogen gas may be higher than a partial pressure of the ammonia gas.

In this case, an etched surface of the second buffer material layer 120p2 may be a plane R or both the plane R and a plane M. According to some example embodiments, since an etch rate of the first threading dislocations TD1 is higher than an etch rate of the third threading dislocation, portions of the first buffer material layer 120p1 corresponding to the first threading dislocations TD1 may be etched at a higher rate than portions of the first buffer material layer 120p1 corresponding to the third threading dislocations TD3.

According to some example embodiments, etched surfaces of portions of the second buffer material layer 120p2 corresponding to the first threading dislocations TD1 may expose the plane R and the plane M. According to some example embodiments, etched surfaces of portions of the second buffer material layer 120p2 corresponding to the second threading dislocations TD2 may expose the plane R and the plane M. According to some example embodiments, etched surfaces of portions of the second buffer material layer 120p2 corresponding to the third threading dislocations TD3 may expose the plane R.

According to some example embodiments, an etched depth and etched width of the portions of the second buffer material layer 120p2 corresponding to the first threading dislocations TD1 may be greater than an etched depth and etched width of the portions of the second buffer material layer 120p2 corresponding to the second threading dislocations TD2. According to some example embodiments, an etched depth and etched width of the portions of the second buffer material layer 120p2 corresponding to the second threading dislocations TD2 may be greater than an etched depth and etched width of the portions of the second buffer material layer 120p2 corresponding to the third threading dislocations TD3. According to some example embodiments, the etched portions of the second buffer material layer 120p2 may have hexagonal symmetry.

Referring to FIGS. 3A, 4E, and 4F, in process P30, the second buffer material layer 120p2 may be etched to form a buffer layer 120. According to some example embodiments, the second buffer material layer 120p2 may be etched by reducing a partial pressure ratio of ammonia gas in an atmosphere of a reactor for etching the first buffer material layer (refer to 120p1 in FIG. 4D). Thus, the buffer layer 120 including a plurality of voids, for example, first to third voids v1, v2, and v3 may be formed. According to some example embodiments, the first to third voids v1, v2, and v3 may expose the plane M. According to some example embodiments, the first to third voids v1, v2, and v3 may not expose the plane R. According to some example embodiments, the second buffer material layer 120p2 may be etched for an amount of time equal to or shorter than the amount of time taken to etch the first buffer material layer (refer to 120p1 in FIG. 4D). According to some example embodiments, after the second buffer material layer 120p2 is etched, a wet etching process may be further performed to remove the redeposited residue, but the inventive concepts is not limited thereto.

Figure 4G:
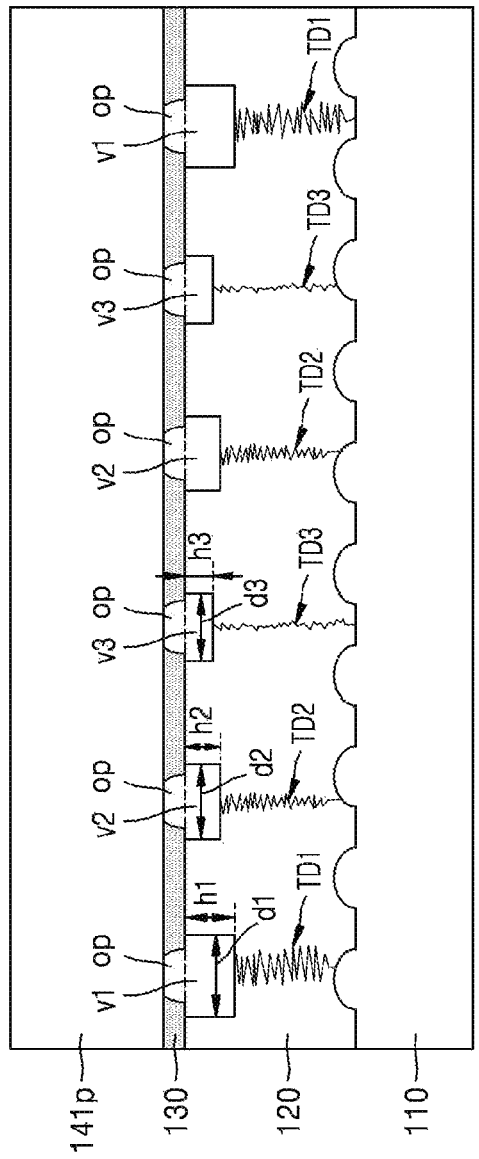

Subsequently, referring to FIGS. 3A and 4G, in process P40, a first-conductivity-type semiconductor material layer 141p may be provided.

According to some example embodiments, the first-conductivity-type semiconductor material layer 141p may be provided by using a method, such as an MOCVD method, an HVPE method, and an MBE method. The first-conductivity-type semiconductor material layer 141p may have substantially the same composition as the first-conductivity-type semiconductor layer 141 described with reference to FIG. 1A.

According to some example embodiments, an atmospheric gas in the reactor (e.g., the MOCVD reactor, the HVPE reactor, or the MBE reactor) may be converted into $N_2$ gas, and the first-conductivity-type semiconductor material layer 141p may be provided while inhibiting a Group-III source gas from being supplied into the first to third voids v1, v2, and v3.

According to some example embodiments, the first-conductivity-type semiconductor material layer 141p may be grown at high speed by converting the atmospheric gas in the reactor (e.g., the MOCVD reactor, the HVPE reactor, or the MBE reactor) into $H_2$ gas. In this case, a conductive semiconductor material may be deposited on portions of bottoms of the first to third voids v1, v2, and v3. However, as the growth of the first-conductivity-type semiconductor material layer 141p continues, a grown surface of the first-conductivity-type semiconductor material layer 141p may rapidly move upward so that the Group-III source gas supplied into the first to third voids v1, v2, and v3 may be gradually reduced. Thus, the buffer layer 120 including the first to third voids v1, v2, and v3 may be formed.

In some example embodiments, when a migration length of Group-III atoms in the reactor is a particular (or, alternatively, predetermined) value or more, a pressure may be raised during initial growth of the first-conductivity-type semiconductor material layer 141p so that the deposition of the first-conductivity-type semiconductor material layer 141p in the first to third voids v1, v2, and v3 may be effectively inhibited.

In the method of manufacturing the light-emitting device according to some example embodiments, as described with reference to FIGS. 4E and 4F, the first to third voids v1, v2, and v3 may be formed not to expose the plane R of the buffer layer 120. Since the first to third voids v1, v2, and v3 do not expose the plane R having a high growth rate, the first to third voids v1, v2, and v3 may be prevented from being filled with the first-conductivity-type semiconductor material layer 141p during the formation of the first-conductivity-type semiconductor material layer 141p.

According to some example embodiments, when the first-conductivity-type semiconductor material layer 141p is formed, silicon may be doped into the first-conductivity-type semiconductor material layer 141p until the first-conductivity-type semiconductor material layer 141p reaches a particular (or, alternatively, predetermined) thickness. Subsequently, silicon may not be doped into the first-conductivity-type semiconductor material layer 141p. According to some example embodiments, when the first-conductivity-type semiconductor material layer 141p is formed, a first pressure may be maintained until the first-conductivity-type semiconductor material layer 141p reaches a particular (or, alternatively, predetermined) thickness. Subsequently, a second pressure higher than the first pressure may be maintained.

Figure 4H:
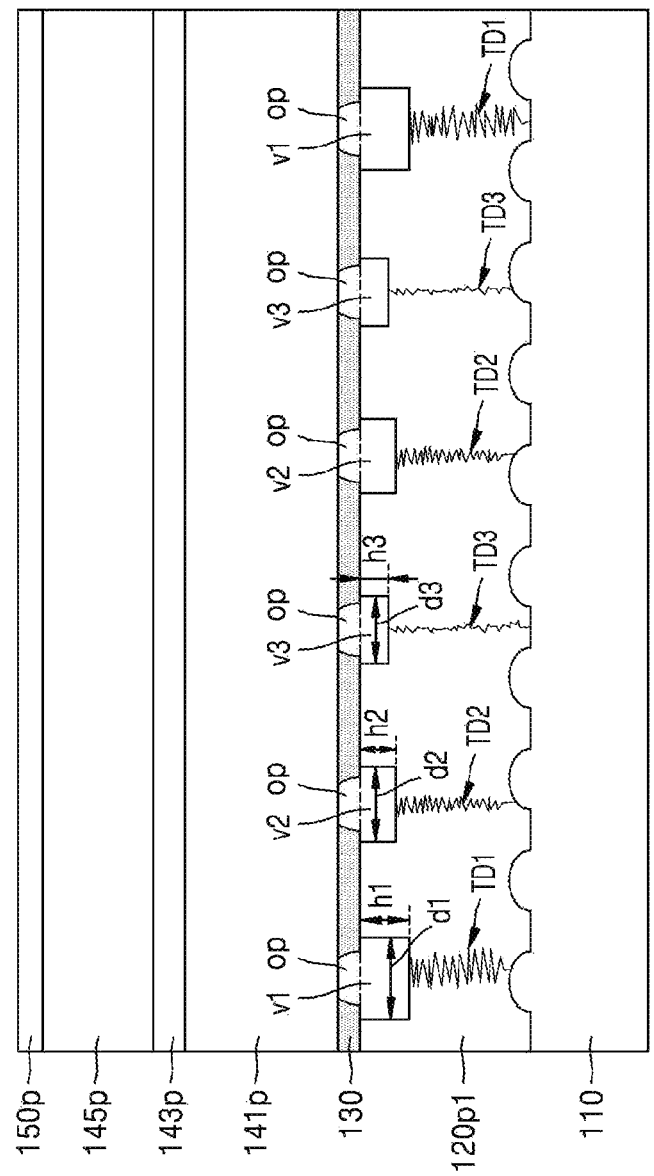

Thereafter, referring to FIGS. 3A and 4H, in process P40, an active material layer 143p, a second-conductivity-type semiconductor material layer 145p, and an ohmic material layer 150p may be provided.

According to some example embodiments, the active material layer 143p, the second-conductivity-type semiconductor material layer 145p, and the ohmic material layer 150p may be provided by using a method, such as an MOCVD method, an HVPE method, and an MBE method.

The active material layer 143p, the second-conductivity-type semiconductor material layer 145p, and the ohmic material layer 150p may have substantially the same compositions as the active layer 143, the second-conductivity-type semiconductor layer 145, and the ohmic contact layer 150, respectively, which are described with reference to FIG. 1A.

According to some example embodiments, a superlattice layer may be provided before the active material layer 143p is provided. According to some example embodiments, the superlattice layer may be provided by using a method, such as an MOCVD method or an atomic layer deposition (ALD) method. According to some example embodiments, quantum barrier layers and QW layers may be alternately provided to provide the superlattice layer. When the superlattice layer is provided by using an MOCVD method, an organic metal compound gas (e.g., trimethylgallium and trimethylaluminum) and a nitrogen-containing gas (e.g., ammonia ($NH_3$)) may be supplied as reactive gases into a reactor in which the substrate 110 is installed.

Figure 5A:
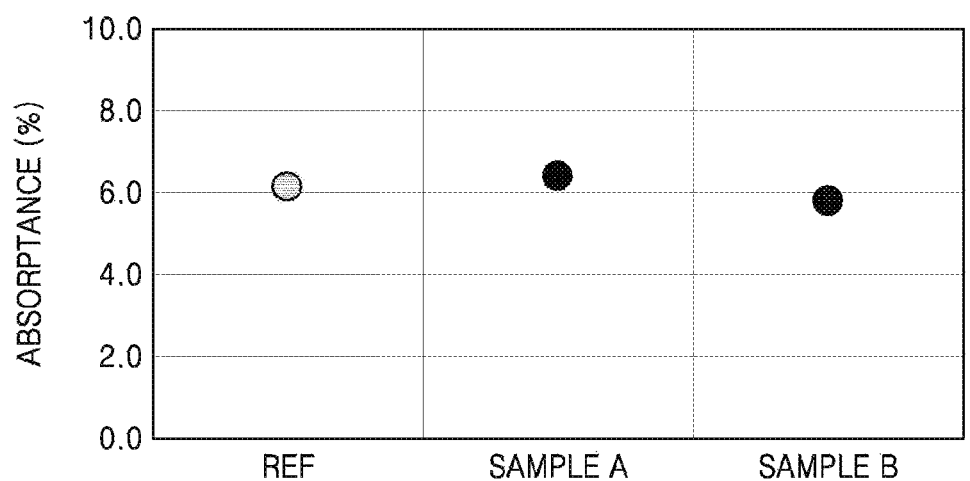
FIGS. 5A and 5B are graphs showing effects of a method of manufacturing a light-emitting device according to some example embodiments.
Figure 5B:
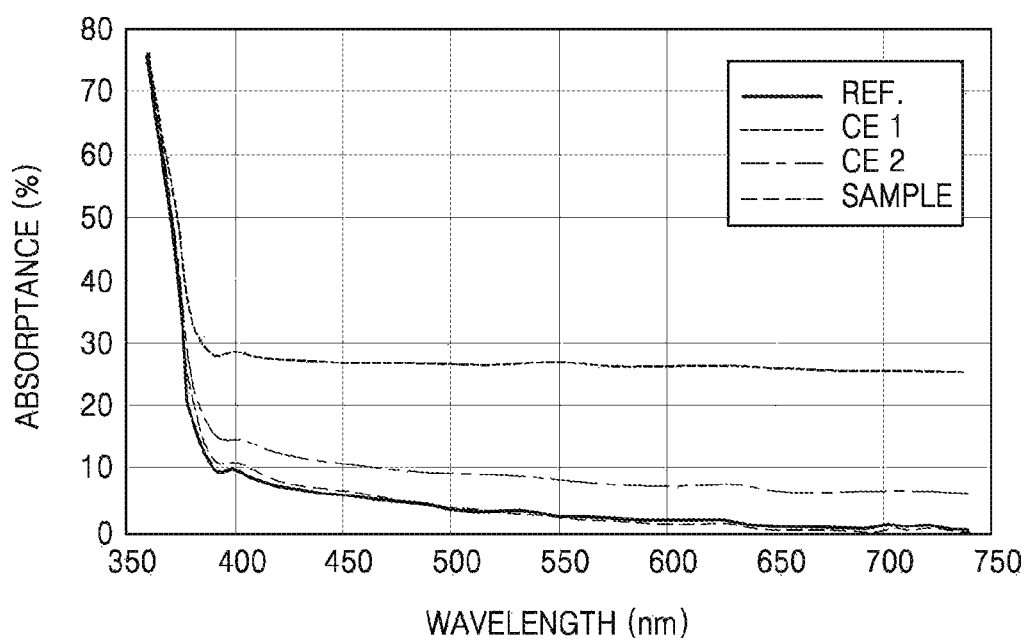

FIGS. 5A and 5B are graphs showing effects of a method of manufacturing a light-emitting device according to some example embodiments.

FIG. 5A illustrates an absorptance relative to a wavelength in reference example 'ref', first experimental example 'Sample A', and second experimental example 'Sample B'. Here, the absorptance may be defined by a value obtained by subtracting the sum of a reflectance and a transmittance from 1 (i.e., absorptance=1−(reflectance+transmittance).

Reference example 'ref' may show a case in which a process of forming voids is omitted because a light-emitting device is not manufactured by using the method of manufacturing the light-emitting device according to the some example embodiments. Reference example 'ref' may be a workpiece on which a layer corresponding to an ohmic material layer is provided without undergoing a process of forming the second aligned patterns (refer to 132 in FIG. 4C) and the mask layer (refer to 130 in FIG. 4C). Each of first experimental example 'Sample A' and second experimental example 'Sample B' may be a workpiece corresponding to FIG. 4H, which is manufactured according to some example embodiments. Referring to FIG. 5A, it can be confirmed that the absorptance of each of experimental examples 'Sample A' and 'Sample B' is similar to that of reference example 'ref' and the second aligned patterns 132 are substantially completely removed.

Referring back to FIG. 4A, during the formation of the first aligned patterns 131, even if a material included in the first aligned patterns 131 is unintendedly formed into fine particles in an unintended position on the first buffer material layer 120p1, the fine particles are not completely covered with the mask layer 130. Therefore, it is possible to prevent the fine particles from remaining in the final structure. When the fine-sized material included in the first aligned patterns 131 partially remain on workpieces during subsequent processes, a masking effect of the mask layer 130 may be degraded, and the fine-sized material included in the first aligned patterns 131 may be combined with a nitride semiconductor layer (e.g., the buffer layer 120 of FIG. 1A) during a subsequent high-temperature process, thereby increasing an absorptance of the light-emitting device (refer to 100 in FIG. 1A).

Referring to data about experimental examples 'Sample A' and 'Sample B', it can be confirmed that a workpiece obtained by using the method of manufacturing the light-emitting device according to some example embodiments has an absorptance equivalent to that of a workpiece of the related art. Therefore, in the method of manufacturing the light-emitting device according to some example embodiments, since a metal material included in the first aligned patterns 131 is not left in a final structure of the workpiece, the light-emitting device (refer to 100 in FIG. 1A) having enhanced reliability and light extraction efficiency may be provided.

Thereafter, referring to FIG. 1A, to form a mesa structure, a light-emitting stack structure 100p may be dry or wet etched, and first and second electrodes 160A and 160B may be provided to form a light-emitting structure 140. According to some example embodiments, a first-conductivity-type semiconductor material layer 110p may be etched to a particular (or, alternatively, predetermined) depth due to an excessive etching process. However, the inventive concepts is not limited thereto. The first-conductivity-type semiconductor material layer 110p may not be etched, but only a top surface of the first-conductivity-type semiconductor material layer 110p may be partially exposed. Thus, a first-conductivity-type semiconductor layer 141, an active layer 143, a second-conductivity-type semiconductor layer 145, and a superlattice layer may be formed.

As described above, it is known that a porous structure caused by the voids formed in the light-emitting structure may reduce residual stress in a thin film and increase the scattering of light to improve light extraction efficiency. However, the porous structure has not been applied to mass production of light-emitting devices due to additional problems caused by the difficulties of a method of manufacturing the porous structure.

Specifically, in the related art, to form a porous structure on a buffer layer, indium nitride (InN) islands may be grown by supplying trimethyl indium (TMIn) and $NH_3$ to the entire surface of the resultant substrate including a buffer layer in a low-temperature nitrogen atmosphere. In this case, InN islands, each of which has a hexagonal horn shape with a cut upper portion, may be formed on threading dislocations of the buffer layer over the entire top surface of the substrate at a density similar to that of the threading dislocations.

Subsequently, trimethyl aluminum (TMAl) and $NH_3$ source gas may be supplied to the resultant workpiece in a low-temperature nitrogen atmosphere to grow aluminum nitride (AlN). Since InN maintains a wurzite crystal structure, AlN may be conformally grown on InN over the entire surface of the substrate. Thereafter, InN may be decomposed at a high temperature under a low pressure in a hydrogen atmosphere. The related arts have been attempted to form voids in spaces occupied by InN by growing decomposed In atoms at a low temperature so as to discharge the decomposed In atoms through an AlN thin layer having a porous structure.

However, according to the related arts, the decomposed In atoms may not partially penetrate the AlN thin layer but be fused again into an indium metal layer or trapped in the AlN thin layer. The captured In atoms may have a high absorptance and act as a light absorbing element. Also, In may remain in a liquid state under the AlN thin layer and form a phase separation layer with InGaN. Since the phase separation layer has a very low energy bandgap, the phase separation layer may act as a light absorbing element.

The captured In atoms may act as the light absorbing element and deteriorate light extraction efficiency of the light-emitting device. Also, when the AlN layer has an excessively great porous size or does not have a sufficiently great thickness, the AlN layer may not sustain the porous structure but collapse so that a desired porous density cannot be maintained. Conversely, when the AlN layer has an excessively great thickness, new threading dislocations may be generated on the AlN layer, thereby deteriorating the quality of a subsequent light-emitting structure.

In the light-emitting device and the method of manufacturing the same, according to the embodiments, voids may be depressed into the buffer layer so as to inhibit degradation of light extraction efficiency due to a residual indium metal and generation of the threading dislocations on the mask layer (refer to 130 in FIG. 1).

FIG. 5B illustrates an absorptance relative to a wavelength in reference example 'ref', first comparative example CE1, second comparative example CE2, and experimental example 'Sample' according to some example embodiments. Also, the definition of the absorptance may be the same as in FIG. 5A.

A measurement object of reference example 'ref' may be substantially the same as a measurement object of reference example 'ref' described with reference to FIG. 5A. A measurement object of experimental example 'Sample' may be substantially the same as measurement objects of first and second experimental examples 'Sample A' and 'Sample B' described with reference to FIG. 5A. First comparative example CE1 may show a case in which components corresponding to the first aligned patterns (refer to 131 in FIG. 4A) are not completely removed by using an etching process in the middle of a process. Second comparative example CE2 may show a case in which a by-product obtained by etching components corresponding to the first aligned patterns (refer to 131 in FIG. 4A) are redeposited or a foreign material contained in a chamber is redeposited in the middle of a process.

Referring to FIG. 5B, it can be seen that although there is no large difference in absorptance among the respective examples in an ultraviolet band having large photon energy, first and second comparative examples CE1 and CE2 have high absorptances in visible and infrared bands.

In contrast, it can be confirmed that experimental example 'Sample' according to the some example embodiments has substantially the same absorptance as when voids are not formed. Accordingly, it can be inferred that the method of manufacturing the light-emitting device according to the some example embodiments may enhance light extraction efficiency by substantially completely removing a metal material included in the first aligned patterns (refer to 131 in FIG. 4A).

Figure 6C:
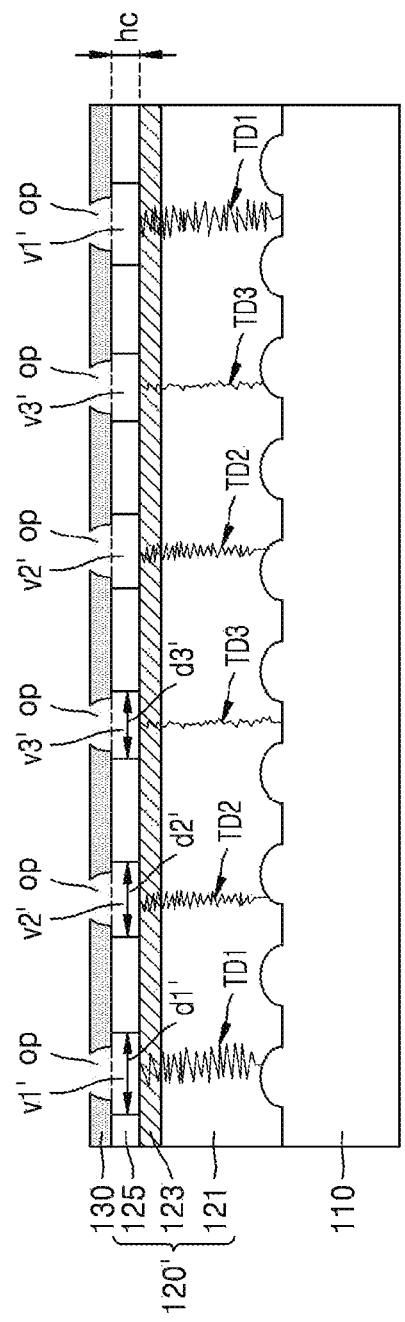

FIGS. 6A, 6B, and 6C are cross-sectional views of a method of manufacturing a light-emitting device according to some example embodiments.

Referring to FIGS. 3C and 6A, in process P10', a buffer material layer 120p' may be provided on a substrate 110.

According to some example embodiments, the process of forming the buffer material layer 120p' on the substrate 110 may include providing a lower buffer layer 121, an etch stop layer 123, and an upper buffer material layer 125p. According to some example embodiments, the process of providing the buffer layer 120' may be similar to the process described with reference to FIGS. 3A and 4A and include further providing aluminum (Al) to form the etch stop layer 123 during the formation of the buffer material layer 120p'.

In addition, first aligned patterns 131 may be provided using a method substantially similar to the method described with reference to FIGS. 3A and 4A.

Thereafter, referring to FIGS. 3C and 6B, in process P20, a mask layer 130 may be provided on the buffer material layer 120p'. Since the process of providing the mask layer 130 on the buffer material layer 120p' is substantially the same as the process described with reference to FIGS. 4A to 4D, detailed descriptions thereof will be omitted.

Subsequently, referring to FIGS. 3C, 6B, and 6C, in process P30, the buffer material layer 120p' may be etched to form a buffer layer 120'. The formation of the buffer layer 120' by etching the buffer material layer 120p' may include forming an upper buffer layer 125 by etching the upper buffer material layer 125p. The process of etching the upper buffer material layer 125p may be substantially the same as process described with reference to FIGS. 4E and 4F.

According to some example embodiments, since bonding strength between a material included in the etch stop layer 123 and nitride is stronger than bonding strength between a material included in the upper buffer material layer 125p and nitride, the etch stop layer 123 may act as a stop point for an etching process. According to some example embodiments, first to third voids v1', v2', and v3' having horizontal lengths d1', d2', and d3', respectively, may formed to substantially the same height, that is, a common height 'hc'.

Thereafter, referring to FIG. 3C, in process P40, a light-emitting structure may be provided. Since the process of providing the light-emitting structure is substantially the same as the process described with reference to FIGS. 4G, 4H, and 1A, detailed descriptions thereof will be omitted.

Figure 7:
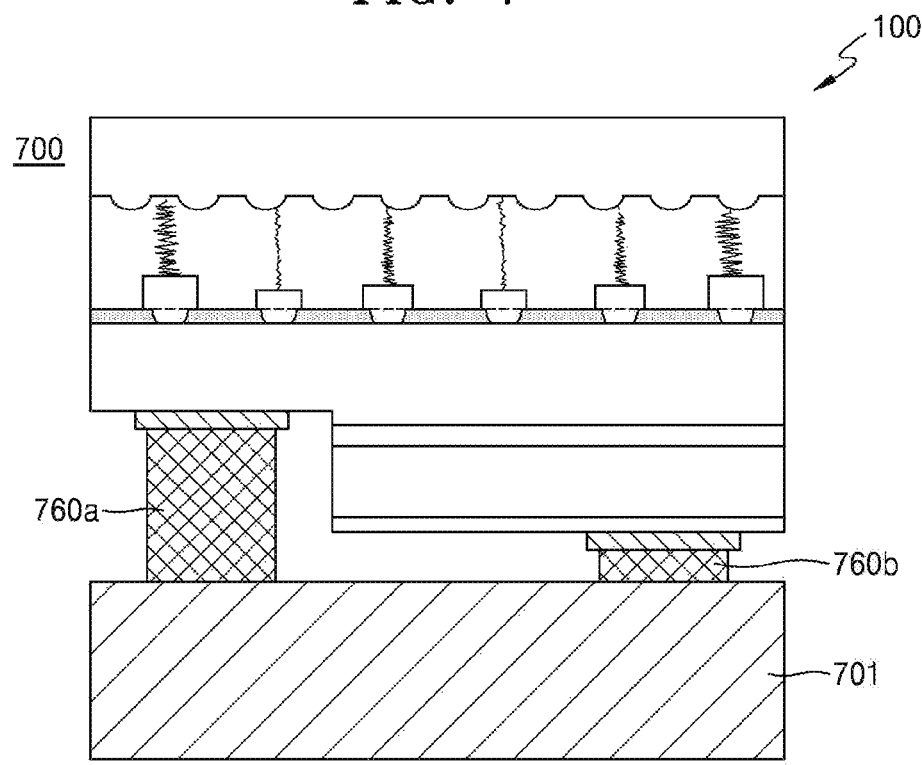
FIGS. 7 and 8 are cross-sectional views of a light-emitting device package including a light-emitting device according to some example embodiments.

FIG. 7 is a cross-sectional view of a light-emitting device package 700 including a light-emitting device according to some example embodiments.

Referring to FIG. 7, the light-emitting device package 700 according to some example embodiments may include a light-emitting device 100 located on a package substrate 701. The light-emitting device 100 may be substantially the same as the light-emitting device 100 described with reference to FIG. 1A. According to some example embodiments, the light-emitting device 100' of FIG. 1B may be used instead of the light-emitting device 100 of FIG. 1A.

First and second stud electrodes 760a and 760b may be located between the first and second electrodes (refer to 160A and 160B in FIG. 1A) and the package substrate 701. According to some example embodiments, the light-emitting device 100 may have a flip-chip structure in which the first and second electrodes (refer to 160A and 160B in FIG. 1) are mounted opposite the package substrate 701.

According to some example embodiments, since threading defects of the light-emitting device 100 are reduced and light extraction efficiency toward a substrate is improved, the light-emitting device package 700 having enhanced reliability and light extraction efficiency may be provided.

Figure 8:
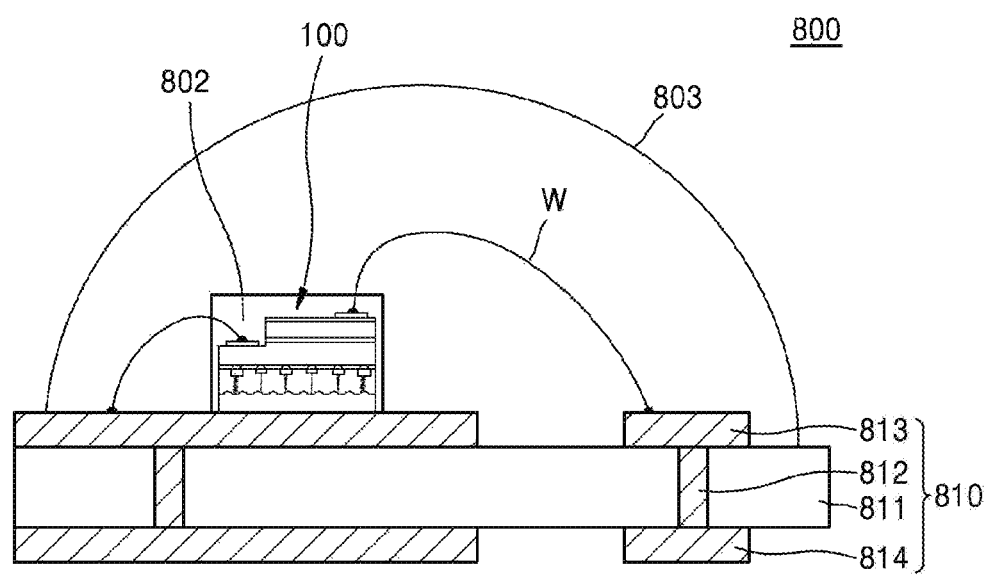

FIG. 8 is a cross-sectional view of a light-emitting device package 800 including a light-emitting device according to some example embodiments.

Referring to FIG. 8, the light-emitting device package 800 may include a light-emitting device 100, a mounting substrate 810, and an encapsulant 803. Also, a wavelength converter 802 may be formed on a top surface and a side surface of the light-emitting device 100. The light-emitting device 100 may be mounted on the mounting substrate 810 and electrically connected to the mounting substrate 810 through a conductive wire W or a substrate (refer to 110 in FIG. 1A).

The mounting substrate 810 may include a substrate main body 811, a top electrode 813, and a bottom electrode 814. Also, the mounting substrate 810 may include a through electrode 812 configured to electrode the top electrode 813 and the bottom electrode 814. The mounting substrate 810 may be a printed circuit board (PCB), a metal-core PCB, a metal PCB, or a flexible PCB. A structure of the mounting substrate 810 is not limited to the shape shown in FIG. 8 and may be applied in various shapes.

The wavelength converter 802 may include a phosphor or quantum dots. According to some example embodiments, the encapsulant 803 may have a dome-shaped lens structure having a convex top surface. In some example embodiments, a top surface of the encapsulant 803 may be formed to have a convex or concave lens structure so that an orientation angle of light emitted through the top surface of the encapsulant 803 may be adjusted.

According to some example embodiments, the density of threading dislocations formed in the active layer (refer to 143 in FIG. 1A) included in the light-emitting device 100 may be reduced, so that the light-emitting device package 800 having enhanced reliability may be provided.

Figure 9:
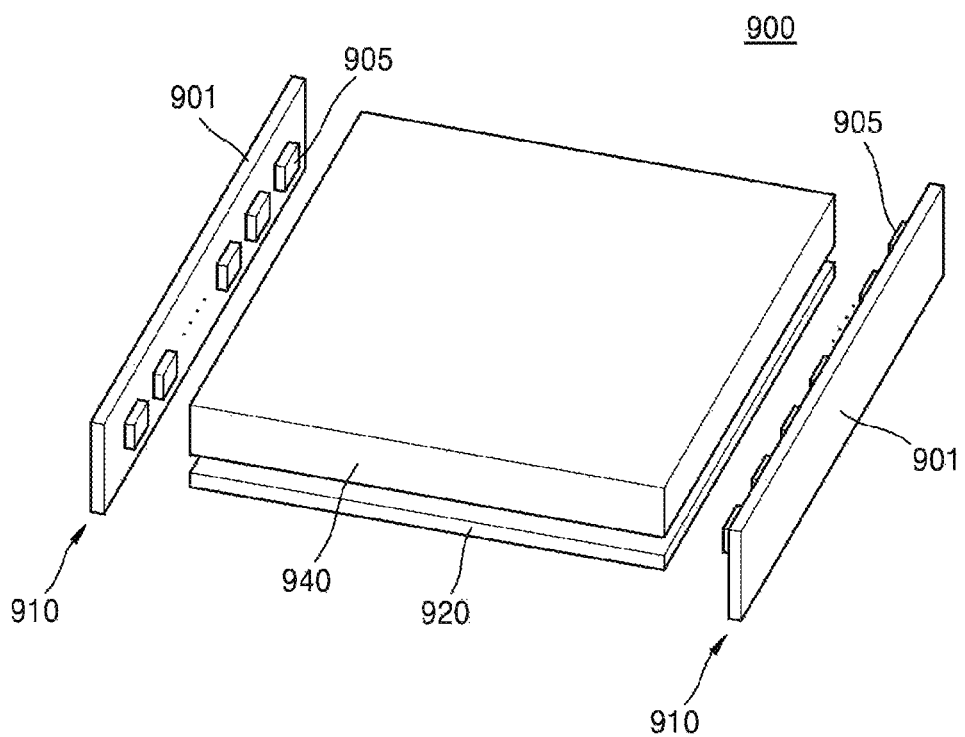
FIG. 9 is a perspective view of a backlight unit (BLU) including a light-emitting device according to some example embodiments.

FIG. 9 is a perspective view of a backlight unit (BLU) 900 including a light-emitting device according to some example embodiments.

Specifically, the BLU 900 may include a light guide plate (LGP) 940 and light source modules 910 provided on two side surfaces of the LGP 940. Also, the BLU 900 may further include a reflective plate 920 located under the LGP 940. The BLU 900 according to some example embodiments may be an edge-type BLU. According to some example embodiments, the light source module 910 may be provided on only one side surface of the LGP 940 or further provided on another side surface. The light source module 910 may include a PCB 901 and a plurality of light sources 905 mounted on a top surface of the PCB 901. The light source 905 may be the above-described light-emitting device (refer to 100 in FIG. 1A) according to some example embodiments.

Figure 10:
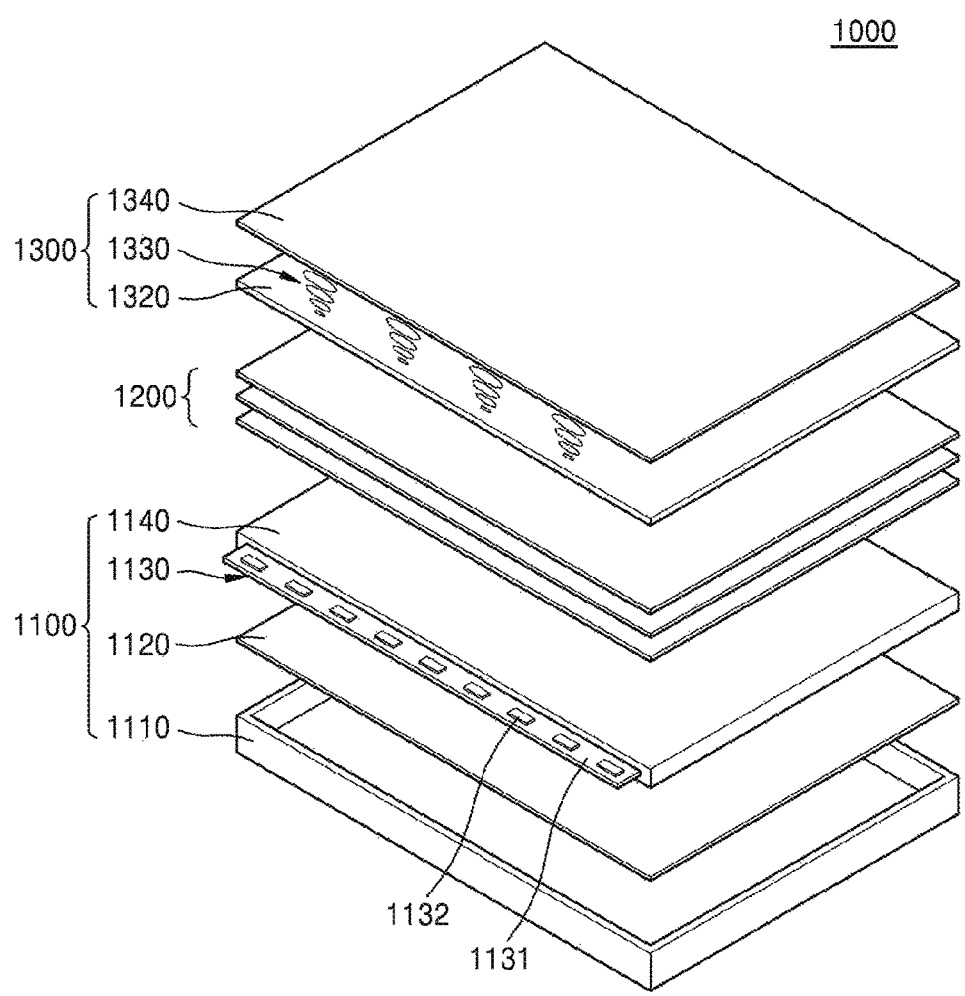
FIG. 10 is an exploded perspective view of a display device including a light-emitting device according to some example embodiments.

FIG. 10 is an exploded perspective view of a display device 1000 including a light-emitting device according to some example embodiments.

Specifically, the display device 1000 may include a BLU 1100, an optical sheet 1200, and an image display panel (e.g., a liquid crystal (LC) panel) 1300. The BLU 1100 may include a bottom case 1110, a reflective plate 1120, an LGP 1140, and a light source module 1130 provided on at least one side surface of the LGP 1140. The light source module 1130 may include a PCB 1131 and a light source 1132.

The light source 1132 may be a side-view-type light-emitting device, which is mounted on a side surface of the LGP 1140 adjacent to an emission surface of the light source 1132. The light source 1132 may be the above-described light-emitting device (refer to 10 in FIG. 1A) according to some example embodiments. The optical sheet 1200 may include several types of sheets, such as a prism sheet or a protective sheet.

The image display panel 1300 may display an image using light emitted by the optical sheet 1200. The image display panel 1300 may include an array substrate 1320, an LC layer 1330, and a color filter substrate 1340. The array substrate 1320 may include pixel electrodes located in a matrix shape, thin-film transistors (TFTs) configured to apply a driving voltage to the pixel electrodes, and signal lines configured to operate the TFTs.

The color filter substrate 1340 may include a transparent substrate, a color filter, and a common electrode. The color filter may include filters configured to selectively transmit light having a specific wavelength from among white light emitted by the BLU 1100. The LC layer 1330 may be rearranged due to an electric field formed the pixel electrodes and the common electrode to adjust a light transmittance of light. The light of which the light transmittance is adjusted may pass through the color filters of the color filter substrate 1340 to display an image. The image display panel 1300 may further include a driver circuit unit configured to process an image signal.

While the inventive concepts have been particularly shown and described with reference to embodiments thereof, it will be understood that various changes in form and details may be made therein without departing from the spirit and scope of the following claims.

What is claimed is:

1. A light-emitting device, comprising:
   a light-emitting structure, the light-emitting structure including
      a first-conductivity-type nitride semiconductor layer on a substrate,
      an active layer on the first-conductivity-type nitride semiconductor layer, and
      a second-conductivity-type nitride semiconductor layer on the active layer;
   a buffer layer between the substrate and the light-emitting structure, the buffer layer including
      a plurality of voids, the plurality of voids extending vertically into the buffer layer from a surface of the buffer layer, the surface proximate to the light-emitting structure, the plurality of voids having different horizontal sectional areas; and
   a mask layer between the buffer layer and the light-emitting structure, the mask layer including a plurality of openings.

2. The light-emitting device of claim 1, wherein the plurality of voids have different heights.

3. The light-emitting device of claim 1, wherein the plurality of voids have substantially common heights.

4. The light-emitting device of claim 3, wherein the buffer layer includes
   a first nitride semiconductor layer,
   a second nitride semiconductor layer, and
   an etch stop layer between the first nitride semiconductor layer and the second nitride semiconductor layer.

5. The light-emitting device of claim 4, wherein the etch stop layer includes aluminum.

6. The light-emitting device of claim 1, wherein the plurality of voids have heights that are less than a vertical length of the buffer layer.

7. The light-emitting device of claim 1, wherein a horizontal sectional shape of each opening of the plurality of openings is a substantially circular shape.

8. The light-emitting device of claim 7, wherein the buffer layer includes a plurality of threading dislocations extending in a perpendicular direction, the plurality of threading dislocations overlapping at least portions of the plurality of openings.

9. The light-emitting device of claim 8, wherein the plurality of voids include
   first voids having a first horizontal sectional area;
   second voids having a second horizontal sectional area, the second horizontal sectional area less than the first horizontal sectional area; and
   third voids having a third horizontal sectional area, the third horizontal sectional area less than the second horizontal sectional area,
   wherein the plurality of threading dislocations include
      first threading dislocations corresponding to the first voids,
      second threading dislocations corresponding to the second voids, and
      third threading dislocations corresponding to the third voids.

10. The light-emitting device of claim 9, wherein
the first voids have a first height,
the second voids have a second height, the second height being less than the first height, and
the third voids have a third height, the third height being less than the second height.

11. The light-emitting device of claim 9, wherein
the first threading dislocations are screw dislocations,
the third threading dislocations are edge dislocations, and
the second threading dislocations are mixed dislocations of the edge dislocations and the screw dislocations.

12. The light-emitting device of claim 9, wherein
the first voids are aligned with the first threading dislocations,
the second voids are aligned with the second threading dislocations, and
the third voids are aligned with the third threading dislocations.

13. A light-emitting device comprising:
a light-emitting structure, the light-emitting structure including
a first-conductivity-type nitride semiconductor layer on a substrate,
an active layer on the first-conductivity-type nitride semiconductor layer, and
a second-conductivity-type nitride semiconductor layer on the active layer;
a buffer layer between the substrate and the light-emitting structure, the buffer layer including
a plurality of voids, the plurality of voids extending vertically into the buffer layer from a surface of the buffer layer, the surface proximate to the light-emitting structure; and
a mask layer between the buffer layer and the light-emitting structure, the mask layer including a plurality of openings, each opening of the plurality of openings having a horizontal sectional shape that is a substantially circular shape.

14. The light-emitting device of claim 13, wherein a maximum horizontal sectional area of each opening of the plurality of openings is less than horizontal sectional areas of the plurality of voids.

15. The light-emitting device of claim 13, wherein the mask layer includes aluminum nitride.

16. A light-emitting device comprising:
a light-emitting structure on a light-transmissive substrate, the light-emitting structure including a first-conductivity-type nitride semiconductor layer, an active layer, and a second-conductivity-type nitride semiconductor layer;
a buffer layer between the light-transmissive substrate and the light-emitting structure, the buffer layer including a plurality of voids, the plurality of voids extending vertically into the buffer layer from a surface of the buffer layer, the surface proximate to the light-emitting structure, the plurality of voids having different horizontal sectional areas;
a first electrode on the first-conductivity-type nitride semiconductor layer, the first electrode coupled to the first-conductivity-type nitride semiconductor layer;
a second electrode on the second-conductivity-type nitride semiconductor layer, the second electrode coupled to the second-conductivity-type nitride semiconductor layer; and
a mask layer between the buffer layer and the light-emitting structure, the mask layer including a plurality of openings.

17. The light-emitting device of claim 16, wherein the plurality of voids have different heights.

18. The light-emitting device of claim 16,
wherein a horizontal sectional shape of each opening of the plurality of openings is a substantially circular shape.

19. The light-emitting device of claim 18, wherein the mask layer includes aluminum nitride.

* * * * *